(12) United States Patent
Wan et al.

(10) Patent No.: US 11,054,590 B1
(45) Date of Patent: Jul. 6, 2021

(54) SCALABLE INTEGRATION OF HYBRID OPTOELECTRONIC AND QUANTUM OPTICAL SYSTEMS INTO PHOTONIC CIRCUITS

(71) Applicant: Massachusetts Institute of Technology, Cambridge, MA (US)

(72) Inventors: Noel Wan, Cambridge, MA (US); Jacques Johannes Carolan, Cambridge, MA (US); Tsung-Ju Lu, Cambridge, MA (US); Ian Robert Christen, Cambridge, MA (US); Dirk Robert Englund, Brookline, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 16/734,727

(22) Filed: Jan. 6, 2020

Related U.S. Application Data

(60) Provisional application No. 62/813,924, filed on Mar. 5, 2019.

(51) Int. Cl.
    *G02B 6/42* (2006.01)
(52) U.S. Cl.
    CPC .................................... *G02B 6/42* (2013.01)
(58) Field of Classification Search
    CPC ... H01L 2924/00014; H01L 2224/1147; H01L 2224/119; G02B 6/12004; G02B 6/30; G02B 6/136; G02B 6/4214; G02B 6/124; G02B 6/13; G02B 6/34; G02B 6/4206;
    (Continued)

(56) References Cited

U.S. PATENT DOCUMENTS 3,647,959 A * 3/1972 Schlesinger ............ H01J 29/14
                                                        348/40
4,700,353 A    10/1987 Van Gieson et al.
(Continued)

OTHER PUBLICATIONS

International Search Report and Written Opinion in International Patent Application No. PCT/US2020/012322 dated Mar. 31, 2020, 12 pages.
(Continued)

*Primary Examiner* — Andrew Jordan
(74) *Attorney, Agent, or Firm* — Smith Baluch LLP

(57) ABSTRACT

A process is provided for the high-yield heterogeneous integration of 'quantum micro-chiplets' (QMCs, diamond waveguide arrays containing highly coherent color centers) with an aluminum nitride (AlN) photonic integrated circuit (PIC). As an example, the process is useful for the development of a 72-channel defect-free array of germanium-vacancy (GeV) and silicon-vacancy (SiV) color centers in a PIC. Photoluminescence spectroscopy reveals long-term stable and narrow average optical linewidths of 54 MHz (146 MHz) for GeV (SiV) emitters, close to the lifetime-limited linewidth of 32 MHz (93 MHz). Additionally, inhomogeneities in the individual qubits can be compensated in situ with integrated tuning of the optical frequencies over 100 GHz. The ability to assemble large numbers of nearly indistinguishable artificial atoms into phase-stable PICs is useful for development of multiplexed quantum repeaters and general-purpose quantum computers.

23 Claims, 33 Drawing Sheets

(58) Field of Classification Search
CPC .... G02B 6/12002; G02B 6/122; G02B 6/428; G02B 6/43
See application file for complete search history.

(56) References Cited

U.S. PATENT DOCUMENTS

| | | | | |
|---|---|---|---|---|
| 4,761,832 | A * | 8/1988 | Gade | G02B 6/3502 398/45 |
| 6,075,631 | A * | 6/2000 | Bala | H04J 14/0227 398/1 |
| 7,271,877 | B2 * | 9/2007 | Fries | G03F 7/70291 355/67 |
| 7,292,613 | B2 * | 11/2007 | Vuckovic | B82Y 10/00 372/43.01 |
| 7,546,000 | B2 * | 6/2009 | Spillane | B82Y 10/00 385/14 |
| 7,546,013 | B1 | 6/2009 | Santori et al. | |
| 7,805,031 | B2 | 9/2010 | Spillane et al. | |
| 8,149,888 | B1 | 4/2012 | Schliwa et al. | |
| 8,200,047 | B1 * | 6/2012 | Kowalczyk | H01Q 3/2676 385/1 |
| 8,948,560 | B1 * | 2/2015 | Wach | A61B 1/07 385/125 |
| 9,046,650 | B2 * | 6/2015 | Lin | G02B 6/136 |
| 9,722,124 | B2 * | 8/2017 | Melloni | G02B 6/12 |
| 9,880,356 | B2 * | 1/2018 | Latawiec | G02B 6/29341 |
| 9,915,785 | B2 * | 3/2018 | Lin | G01N 21/648 |
| 10,168,497 | B2 * | 1/2019 | Merget | G02B 6/136 |
| 10,539,297 | B2 * | 1/2020 | Miller | F21V 9/30 |
| 2005/0053319 | A1 * | 3/2005 | Doan | G02B 6/43 385/14 |
| 2007/0172235 | A1 * | 7/2007 | Snider | G02B 6/1225 398/45 |
| 2007/0183471 | A1 * | 8/2007 | Vuckovic | G06N 10/00 372/50.11 |
| 2008/0063339 | A1 * | 3/2008 | Spillane | G02B 6/12007 385/14 |
| 2008/0219311 | A1 * | 9/2008 | Bratkovski | G02B 6/12007 372/45.011 |
| 2009/0140275 | A1 * | 6/2009 | Santori | G02B 6/0229 257/98 |
| 2009/0238528 | A1 * | 9/2009 | Spillane | G02F 1/01708 385/129 |
| 2012/0076166 | A1 * | 3/2012 | Schliwa | H01L 33/06 372/45.011 |
| 2014/0264030 | A1 * | 9/2014 | Lin | G01N 21/35 250/338.4 |
| 2015/0085490 | A1 | 3/2015 | Miller et al. | |
| 2016/0337731 | A1 * | 11/2016 | Graves | H04Q 11/0005 |
| 2017/0237519 | A1 * | 8/2017 | Chuang | H01S 5/0064 398/65 |
| 2017/0276870 | A1 * | 9/2017 | Snyman | G02B 6/136 |
| 2017/0329086 | A1 | 11/2017 | Latawiec et al. | |
| 2018/0180826 | A1 | 6/2018 | Merget et al. | |
| 2020/0200362 | A1 * | 6/2020 | Miller | F21V 9/38 |
| 2020/0279972 | A1 * | 9/2020 | Alen Mill N | H01L 33/0012 |

OTHER PUBLICATIONS

Zhu et al., "Aluminum nitride electro-optic phase shifter for backend integration on silicon." Optics express 24.12 (2016): 12501-12506.
Atatüre et al., "Material platforms for spin-based photonic quantum technologies." Nature Reviews Materials 3.5 (2018): 38-51.
Awschalom et al., "Quantum technologies with optically interfaced solid-state spins." Nature Photonics 12.9 (2018): 516-527.
Becker et al., "All-optical control of the silicon-vacancy spin in diamond at millikelvin temperatures." Physical review letters 120.5 (2018): 053603. 6 pages.
Becker et al., "Coherence Properties and Quantum Control of Silicon Vacancy Color Centers in Diamond (Phys. Statues Solidi A 11/2017)." physica status solidi (a) 214.11 (2017): 1770170. 11 pages.
Bernien et al., "Heralded entanglement between solid-state qubits separated by three metres." Nature 497.7447 (2013); 86-90.
Bersin et al., "Individual control and readout of qubits in a sub-diffraction volume." npj Quantum Information 5.1 (2019): 38. 6 pages.
Bhaskar et al., "Experimental demonstration of memory-enhanced quantum communication." arXiv preprint arXiv:1909.01323 (2019). 17 pages.
Bhaskar et al., "Quantum nonlinear optics with a germanium-vacancy color center in a nanoscale diamond waveguide." Physical review letters 118.22 (2017): 223603. 6 pages.
Bradac et al., "Quantum nanophotonics with group IV defects in diamond." Nature Communications 10.1 (2019): 1-13.
Bradley et al., "A ten-qubit solid-state spin register with quantum memory up to one minute." Physical Review X 9.3 (2019): 031045. 12 pages.
Desiatov et al., "Ultra-low-loss integrated visible photonics using thin-film lithium niobate." Optica 6.3 (2019): 380-384.
Dibos et al., "Atomic source of single photons in the telecom band." Physical review letters 120.24 (2018): 243601. 6 pages.
Elshaari et al., "On-chip single photon filtering and multiplexing in hybrid quantum photonic circuits." Nature communications 8.1 (2017): 379. 8 pages.
Ghosh et al., "Piezoelectric actuation of aluminum nitride contour mode optomechanical resonators." Optics express 23.12 (2015): 15477-15490.
Harris et al., "Quantum transport simulations in a programmable nanophotonic processor." Nature Photonics 11.7 (2017): 447-452.
Hensen et al., "Experimental loophole-free violation of a Bell inequality using entangled electron spins separated by 1.3 km." arXiv preprint arXiv:1508.05949 (2015). 8 pages.
Humphreys et al., "Deterministic delivery of remote entanglement on a quantum network." Nature 558.7709 (2018): 268-273.
Kim et al., "A CMOS-integrated quantum sensor based on nitrogen—vacancy centres." Nature Electronics 2.7 (2019): 284-289.
Kim et al., "Hybrid integration of solid-state quantum emitters on a silicon photonic chip." Nano letters 17.12 (2017): 7394-7400.
Liu et al., "Ultra-high-Q UV microring resonators based on a single-crystalline AlN platform." Optica 5.10 (2018): 1279-1282.
Lodahl et al., "Interfacing single photons and single quantum dots with photonic nanostructures." Reviews of Modern Physics 87.2 (2015): 347-400.
Lu et al., "Aluminum nitride integrated photonics platform for the ultraviolet to visible spectrum." Optics express 26.9 (2018): 11147-11160.
Machielse et al., "Quantum interference of electromechanically stabilized emitters in nanophotonic devices." Physical Review X 9.3 (2019): 031022. 11 pages.
Maity et al., "Spectral alignment of single-photon emitters in diamond using strain gradient." Physical Review Applied 10.2 (2018): 024050. 7 pages.
Meesala et al., "Strain engineering of the silicon-vacancy center in diamond." Physical Review B 97.20 (2018): 305444. 13 pages.
Monroe et al., "Large-scale modular quantum-computer architecture with atomic memory and photonic interconnects." Physical Review A 89.2 (2014): 022317. 16 pages.
Mouradian et al., "A tunable waveguide-coupled cavity design for scalable interfaces to solid-state quantum emitters." APL Photonics 2.4 (2017): 046103.
Mouradian et al., "Rectangular photonic crystal nanobeam cavities in bulk diamond." Applied Physics Letters 111.2 (2017): 021103. 5 pages.
Mouradian et al., "Scalable integration of long-lived quantum memories into a photonic circuit." Physical Review X 5.3 (2015): 031009. 8 pages.
Munro et al., "From quantum multiplexing to high-performance quantum networking." Nature Photonics 4.11 (2010): 792. 5 pages.
Muralidharan et al., "Optimal architectures for long distance quantum communication." Scientific reports 6 (2016): 20463. 10 pages.
Najafi et al., "On-chip detection of non-classical light by scalable integration of single-photon detectors." Nature communicatons 6 (2015): 5873. 8 pages.

(56) References Cited

OTHER PUBLICATIONS

Nemoto et al., "Photonic architecture for scalable quantum information processing in diamond." Physical Review X 4.3 (2014): 031022. 12 pages Nguyen et al., "Quantum network nodes based on diamond qubits with an efficient nanophotonic interface." Physical review letters 123.18 (2019): 183602. 6 pages.

Nickerson et al., "Freely scalable quantum technologies using cells of 5-to-50 qubits with very lossy and noisy photonic links." Physical Review X 4.4 (2014): 041041. 17 pages.

Pant et al., "Percolation based architecture for cluster state creation using photon-mediated entanglement between atomic memories." arXiv preprint arXiv:1704.07292 (2017). 8 pages.

Patra et al., "Cryo-CMOS circuits and systems for quantum computing applications." IEEE Journal of Solid-State Circuits 53.1 (2017): 309-321.

Piparo et al., "Quantum multiplexing." Physical Review A 99.2 (2019): 022337. 11 pages.

Rogers et al., "Multiple intrinsically identical single-photon emitters in the solid state." Nature communications 5.1 (2014): 1-6.

Schröder et al. "Scalable focused ion beam creation of nearly lifetime-limited single quantum emitters in diamond nanostructures." Nature communications 8 (2017): 15376. 7 pages.

Siyushev et al., "Optical and microwave control of germanium-vacancy center spins in diamond." Physical Review B 96.8 (2017): 081201. 5 pages.

Stegmaier et al., "Broadband directional coupling in aluminum nitride nanophotonic circuits." Optics express 21.6 (2013): 7304-7315.

Sukachev et al., "Silicon-vacancy spin qubit in diamond: a quantum memory exceeding 10 ms with single-shot state readout." Physical review letters 119.22 (2017): 223602. 6 pages.

Trusheim et al., "Transform-limited photons from a tin-vacancy spin in diamond." arXiv preprint arXiv:1811.07777 (2018).

Wan et al., "Large-scale integration of near-indistinguishable artificial atoms in hybrid photonic circuits." arXiv preprint arXiv:1911.05265 (2019). 11 pages.

Wan et al., "Two-dimensional photonic crystal slab nanocavities on bulk single-crystal diamond." Applied Physics Letters 112.14 (2018): 141102. 5 pages.

Wang et al., "Integrated lithium niobate electro-optic modulators operating at CMOS-compatible voltages." Nature562.7725 (2018): 101-104.

Wehner et al., "Quantum internet: A vision for the road ahead." Science 362.6412 (2018): eaam9288. 11 pages.

Xiong et al., "Low-loss, silicon integrated, aluminum nitride photonic circuits and their use for electro-optic signal processing." Nano letters 12.7 (2012): 3562-3568.

Zhong et al., "Optically addressing single rare-earth ions in a nanophotonic cavity." Physical review letters 121.18 (2018): 183603. 6 pages.

\* cited by examiner

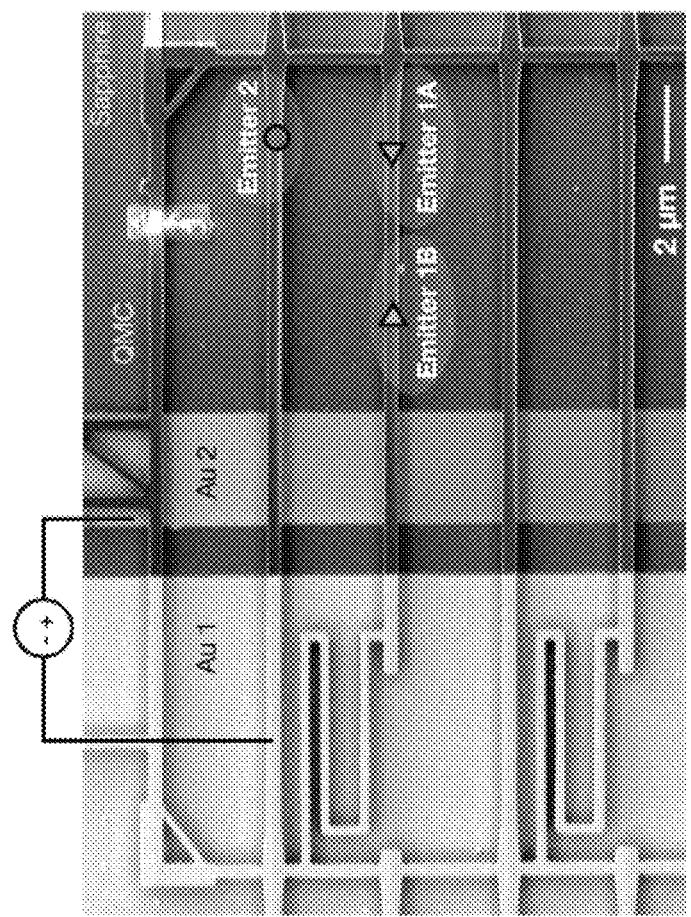
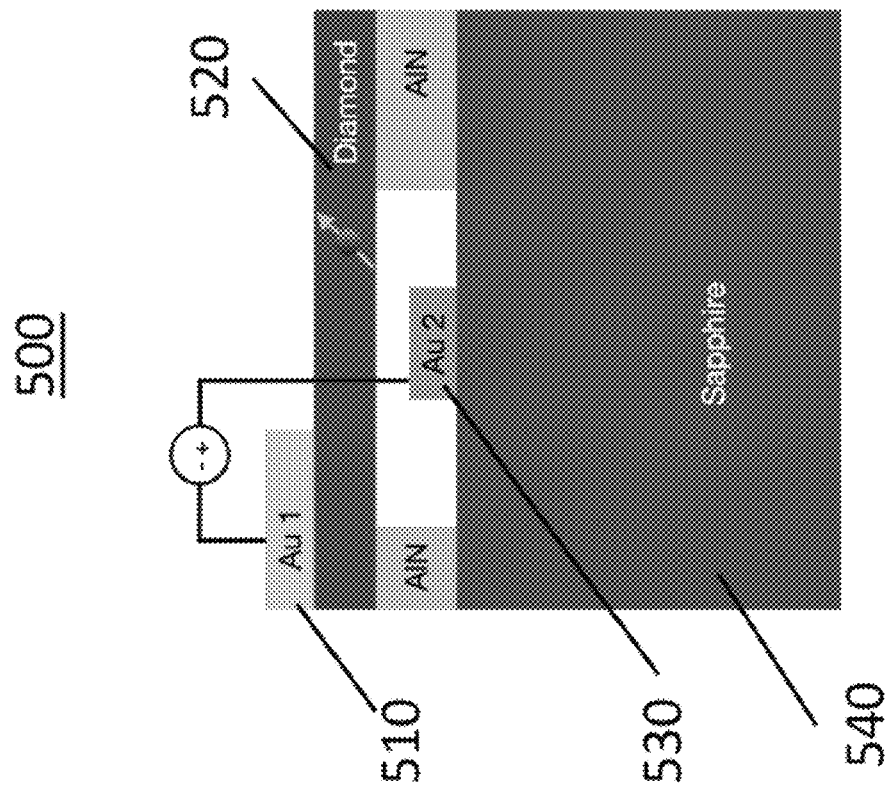
FIG. 5B
FIG. 5A

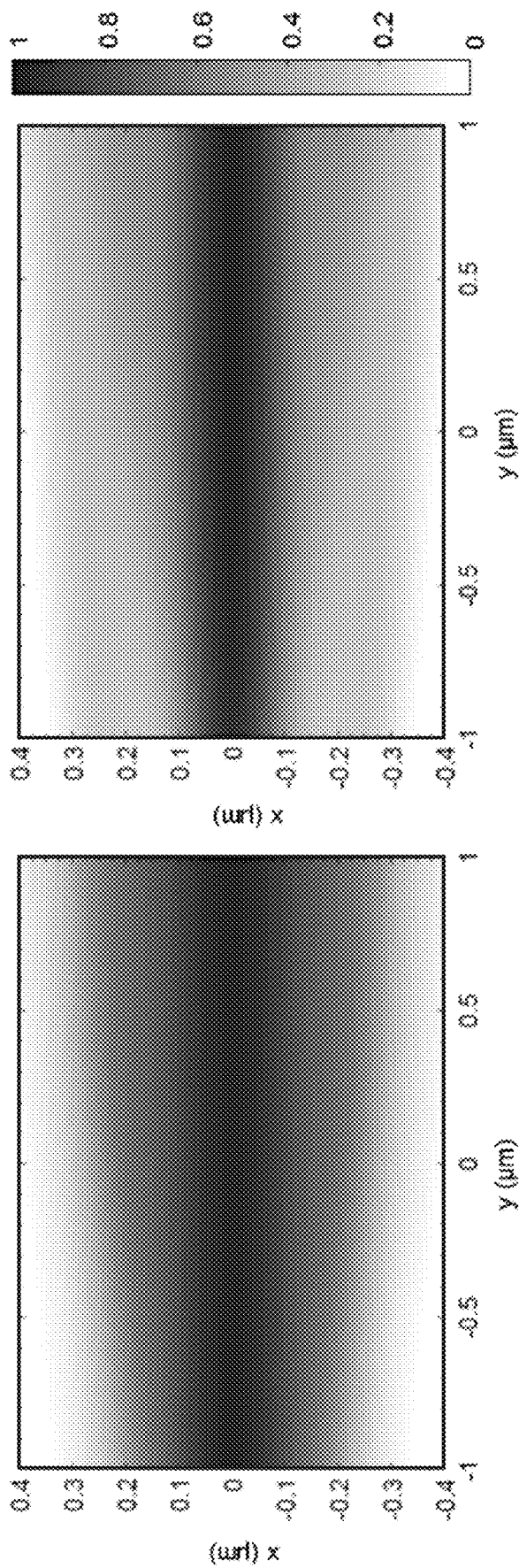

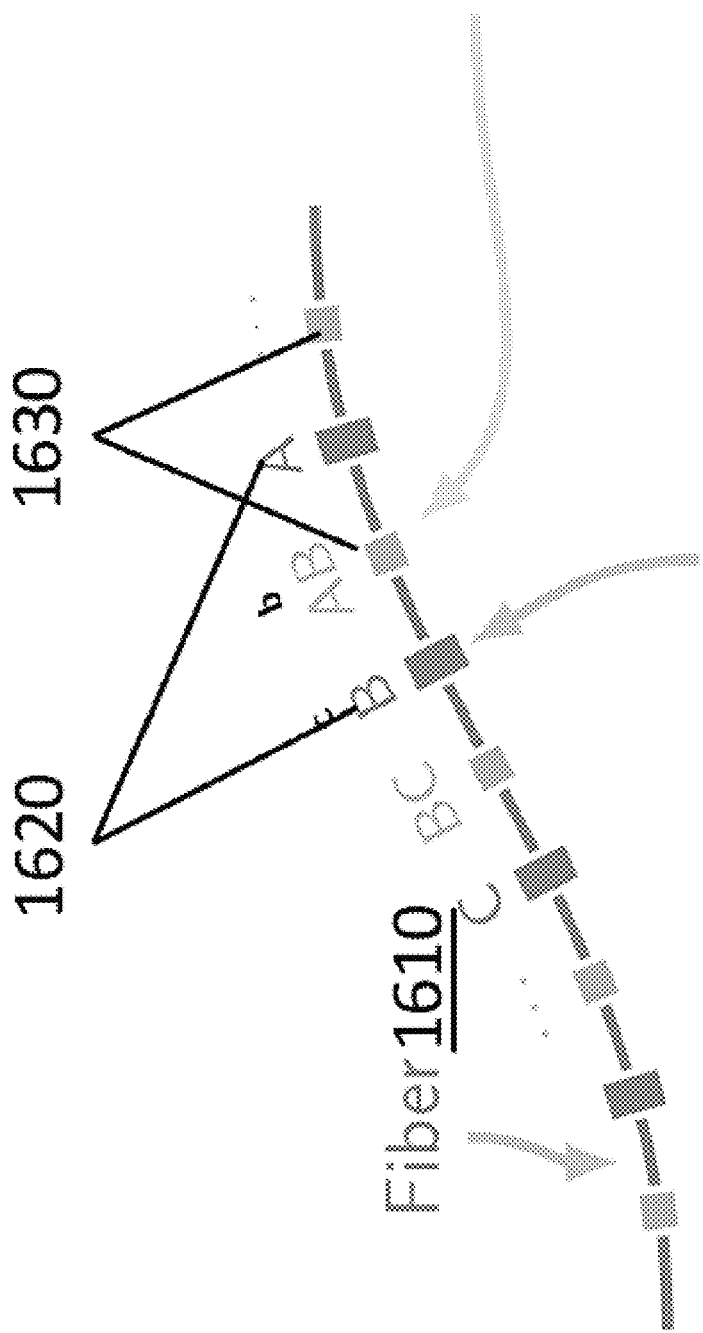
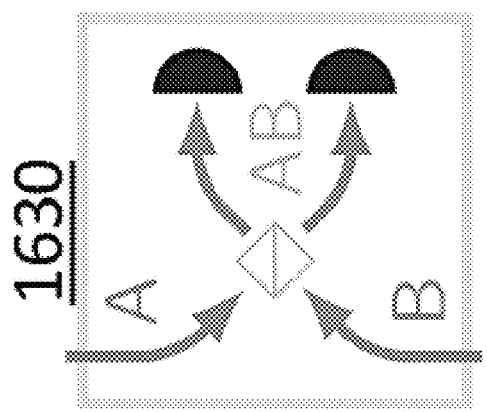
FIG. 16A
FIG. 16B

SCALABLE INTEGRATION OF HYBRID OPTOELECTRONIC AND QUANTUM OPTICAL SYSTEMS INTO PHOTONIC CIRCUITS

CROSS-REFERENCE TO RELATED APPLICATION(S)

This application claims priority, under 35 U.S.C. § 119(e), to U.S. Application No. 62/813,924, filed Mar. 5, 2019, which is incorporated herein by reference in its entirety.

GOVERNMENT SUPPORT STATEMENT

This invention was made with Government support under Grant Nos. EFMA1641064, PHY1734011 and OAC1839159 awarded by the National Science Foundation (NSF); Grant No. FA9550-14-1-0052 awarded by the Air Force Office of Scientific Research (AFOSR); Grant No. FA8750-16-2-0141 awarded by the Air Force Research Laboratory (AFRL); Grant No. W911NF-15-2-0067 awarded by the Army Research Office (ARO) and Grant No. 2017-17063000002 awarded by Intelligence Advanced Research Projects Activity (IARPA). The Government has certain rights in the invention.

BACKGROUND

A significant challenge in developing quantum computers and long-range quantum networks lies in the distribution of entanglement across many individually controllable qubits. Color centers in diamond have emerged as leading solid-state 'artificial atom' qubits, enabling on-demand remote entanglement, coherent control of over 10 ancillae qubits with minute-long coherence times, and memory-enhanced quantum communication. A critical next step is to integrate large numbers of artificial atoms with photonic architectures to enable large-scale quantum information processing systems. To date, efforts to do so have been stymied by qubit inhomogeneities, low device yield, and complex device requirements.

SUMMARY

Artificial atom qubits in diamond combine minute-scale quantum memory times with efficient spin-photon interfaces, making them attractive for processing and distributing quantum information. However, the low device yield of functional qubit systems presents a critical barrier to large-scale quantum information processing (QIP). Furthermore, although individual diamond cavity systems coupled to artificial atoms can now achieve excellent performance, the lack of active chip-integrated photonic components and wafer-scale single crystal diamond currently prohibit scaling to large-scale QIP applications.

A promising method to alleviate these constraints is heterogeneous integration (HI), which is increasingly used in advanced microelectronics to assemble separately fabricated sub-components into a single, multifunctional chip. HI approaches have also recently been used to integrate PICs with quantum devices, including quantum dot single-photon sources, superconducting nanowire single-photon detectors, and nitrogen-vacancy (NV) center diamond waveguides. However, these demonstrations assembled components one-by-one, which presents a formidable scaling challenge.

The PICs presented here use diamond 'quantum microchiplets (QMCs)', also sometimes referred to as 'chiplets,' which significantly improve HI assembly yield and accuracy, and can enable, for example a 72-channel defect-free waveguide-coupled artificial atoms-photonics microchip. These PICs feature diamond emitters with high coupling efficiencies, optical coherences near the lifetime limit, and integrated control to compensate for spectral inhomogeneities on chip.

An example PIC includes a substrate and a first array of waveguides integrated with the substrate. The PIC further includes a solid-state chip (a QMC) integrated onto the substrate in alignment with the first array of waveguides, and including an array of quantum emitters, formed in the solid-state chip, to emit photons. The solid-state chip also includes a second array of waveguides integrated with the solid-state chip, each waveguide in the second array of waveguides in optical communication with a corresponding quantum emitter in the array of quantum emitters and with a corresponding waveguide in the first array of waveguides to guide photons from the corresponding quantum emitter to the corresponding waveguide in the first array of waveguides.

A method of making a photonic integrated circuit includes forming a first array of waveguides integrated with a substrate, and forming an array of quantum emitters in a solid-state chip. The method further includes forming a second array of waveguides in the solid-state chip with each waveguide in the second array of waveguides in optical communication with a corresponding quantum emitter in the array of quantum emitters. The method also includes integrating the solid-state chip with the substrate such that each quantum emitter in the array of quantum emitters is in optical communication with a corresponding waveguide in the first array of waveguides via a corresponding waveguide in the second array of waveguides.

A photonic integrated circuit (PIC) includes a substrate and an optical switch network integrated with the substrate. The PIC further includes a first array of waveguides integrated with the substrate in optical communication with the optical switch network, and a first electrode in electrical communication with the substrate. The PIC also includes a diamond chip suspended over the substrate in alignment with the first array of waveguides and including an array of quantum emitters, distributed irregularly within the solid-state chip, to emit pairs of photons. The diamond chip also includes a second array of waveguides integrated with the solid-state chip. Each waveguide in the second array of waveguides is in optical communication with a corresponding quantum emitter in the array of quantum emitters and with a corresponding waveguide in the first array of waveguides to guide the photons from the corresponding quantum emitter to the optical switch network via the corresponding waveguide in the first array of waveguides. The diamond chip also includes a second electrode, in electrical communication with the diamond chip and electrically isolated from the first electrode, to apply a bias voltage across the diamond chip with respect to a potential of the first electrode. The bias voltage strains the diamond chip and tunes an emission wavelength of at least one quantum emitter in the array of quantum emitters.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1 illustrates scalable integration of artificial atoms with photonics. The separate fabrication of sub-components before their final assembly increases the yield, size, and performance of the hybrid emitter-photonics chip. A pick-and-place method transfers pre-screened a quantum microchiplet (QMC) from its parent diamond chip into a socket containing efficient photonic interfaces, as well as electrical wires for controlling color centers.

Figure 5C:
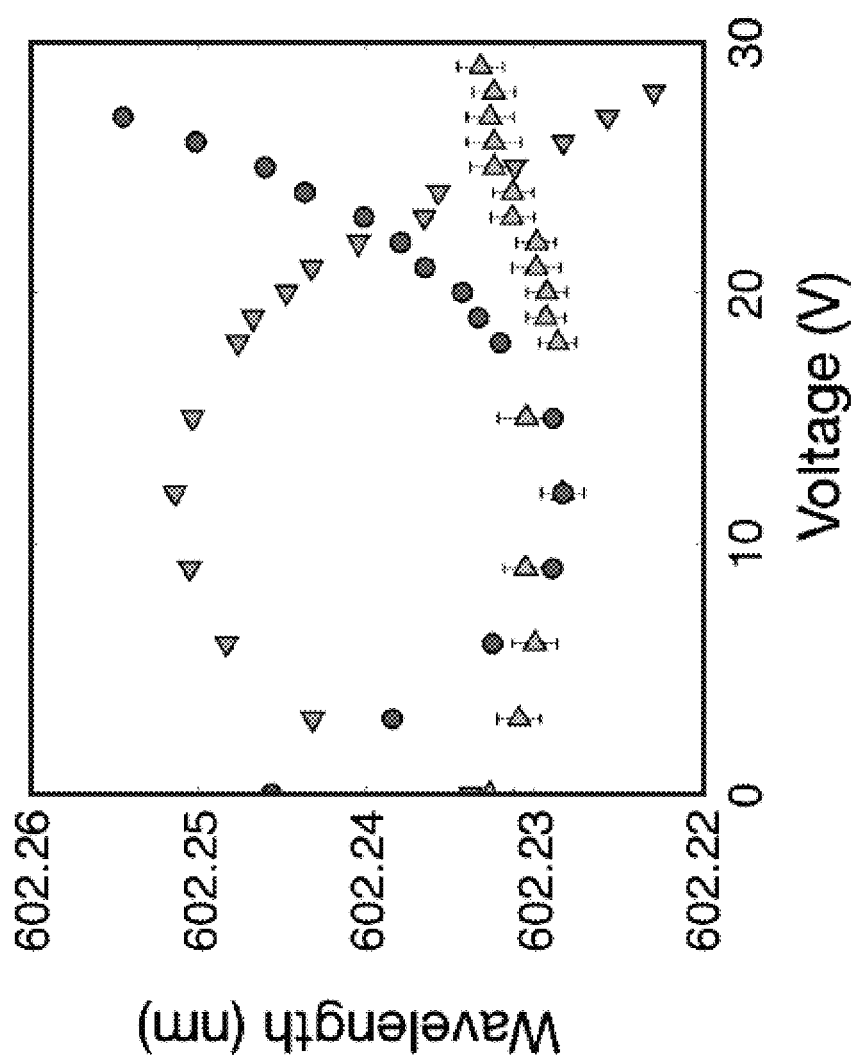
FIG. 5A is a profile view illustrating, on a QMC, application of a DC bias between a metal layer on diamond and metal on a substrate to electrostatically actuate the QMC.
FIG. 5B is a SEM image of gold electrodes and an integrated QMC with varying mechanical rigidity. The optical response of emitters 1A, 1B, and 2 to strain can be estimated with this setup.

FIG. 5C is a plot illustrating that intra-waveguide Emitter 1A and Emitter 1B of FIG. 5B overlap spectrally at 24.5 V. Inter-waveguide overlapping between Emitter 2 and Emitter 1A (1B) occurs at 2 V (12 V). Error bars for Emitter 1A and Emitter 2 are smaller than the data points.

Figure 6A:
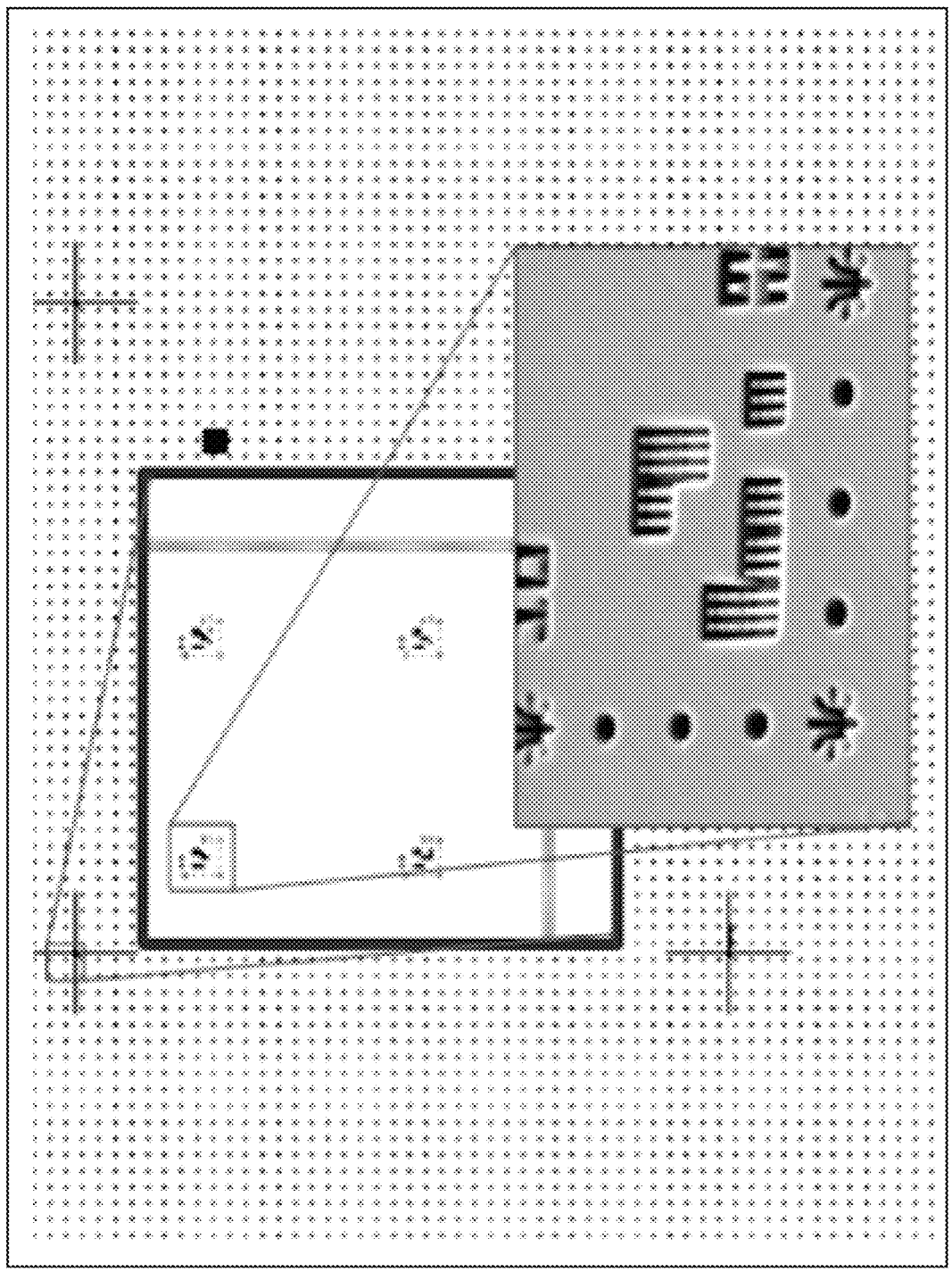

FIG. 6A illustrates fiducial marks etched into a diamond or other substrate for locating emitters implanted, grown, or created in the substrate.

Figure 6B:
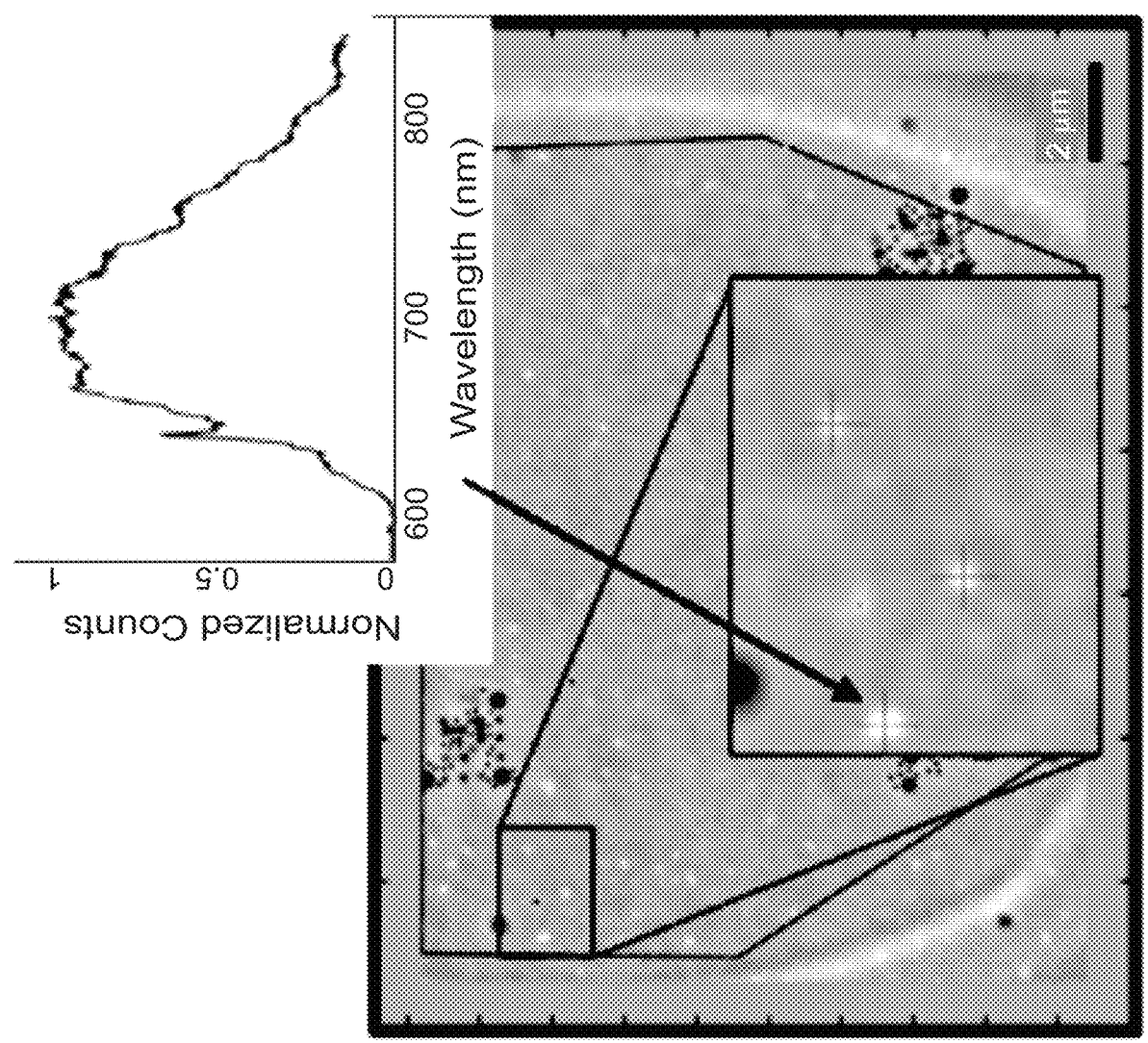

FIG. 6B illustrates optical registration of emitters to fiducial marks in a substrate. Waveguides, cavities, and nanostructures are then patterned surrounding the emitter using e-beam lithography or photolithography and etched using reactive-ion etching or ion milling.

Figure 6C:
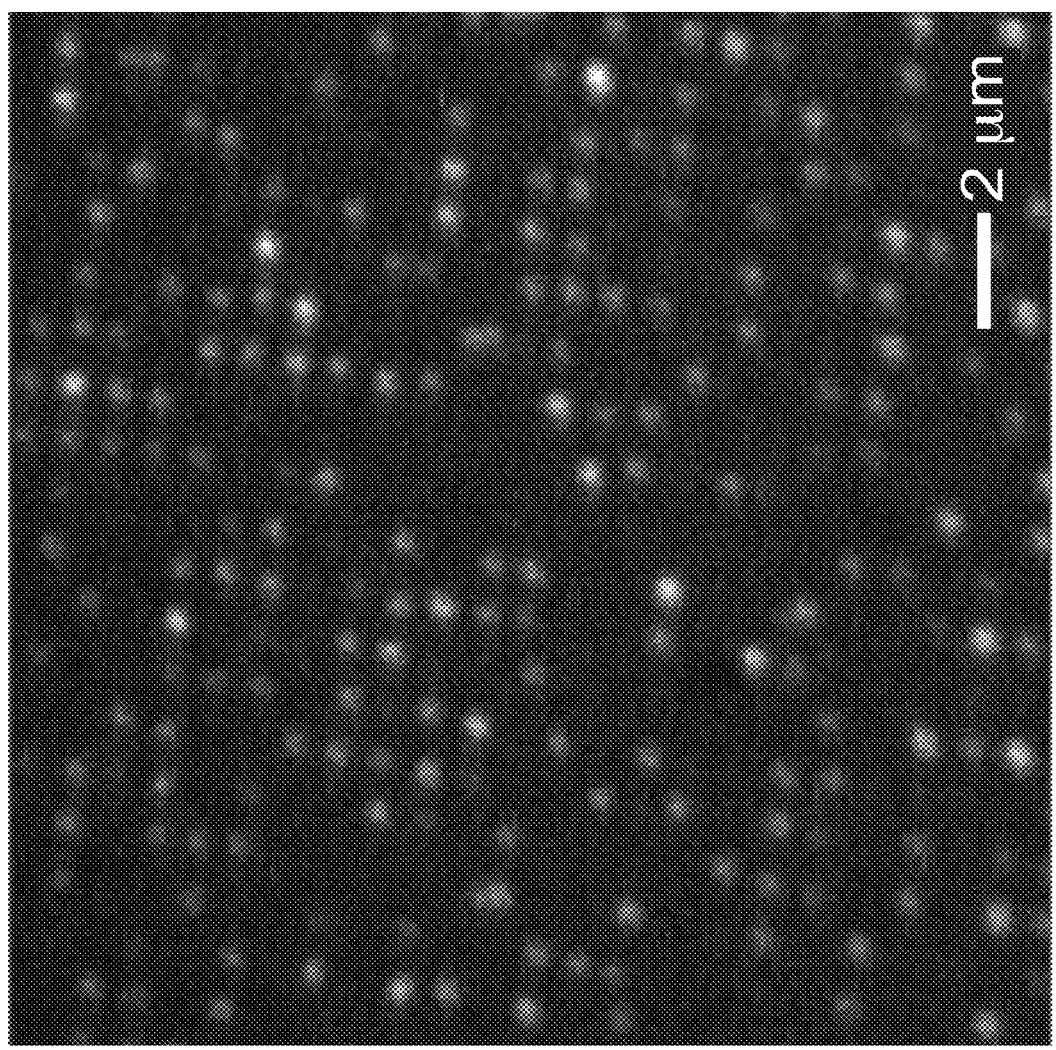

FIG. 6C is an image of a grid array of Germanium Vacancy (GeV) and Silicon-Vacancy (SiV) emitters in diamond, but this approach can be generalized to any quantum emitter. Nanostructures such as waveguides and cavities can be placed around the emitter using a matching pitch using nano lithography. Alternatively, emitters can also be created after the fabrication of nanostructures.

Figure 6D:
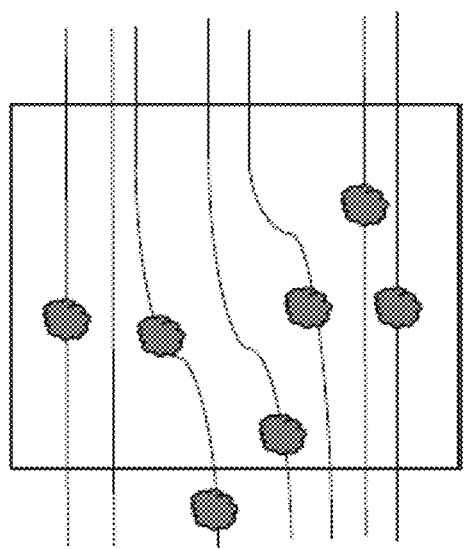

FIG. 6D illustrates irregularly arranged artificial atoms with sufficient quality ("yielding emitters") connected to an array of waveguides or cavity-coupled waveguides for large-scale integration with the PIC.

Figure 6E:
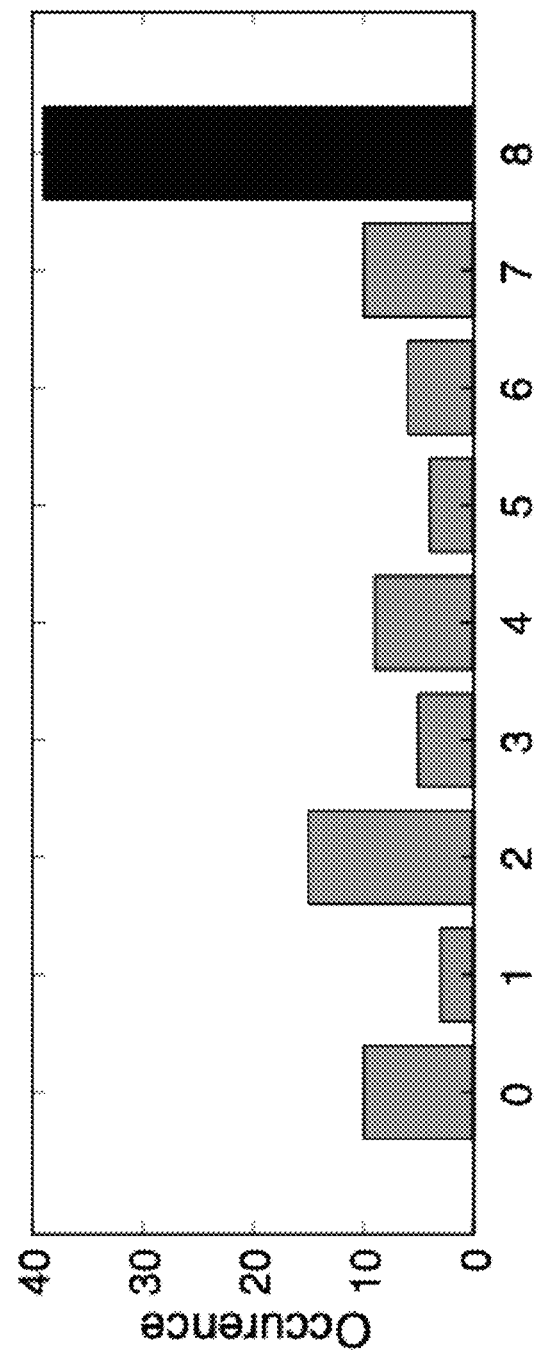

FIG. 6E is a histogram of the number of emitter-coupled waveguides within a QMC.

Figure 7C:
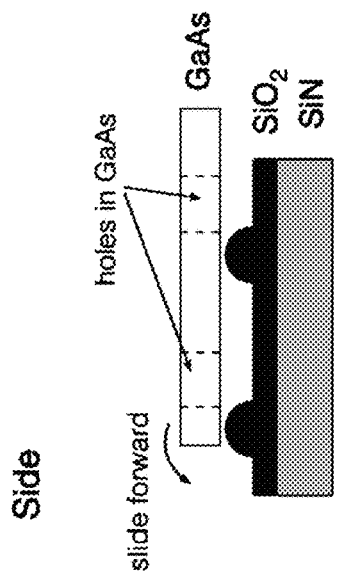
Figure 7B:
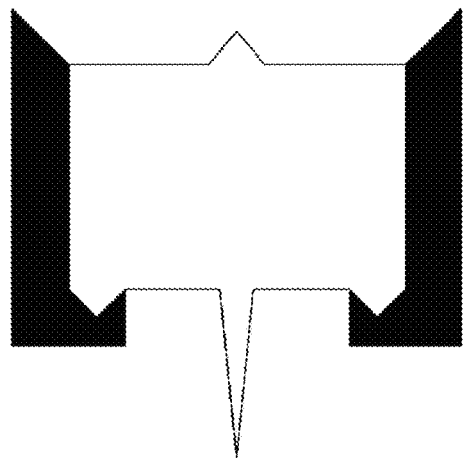
Figure 7E:
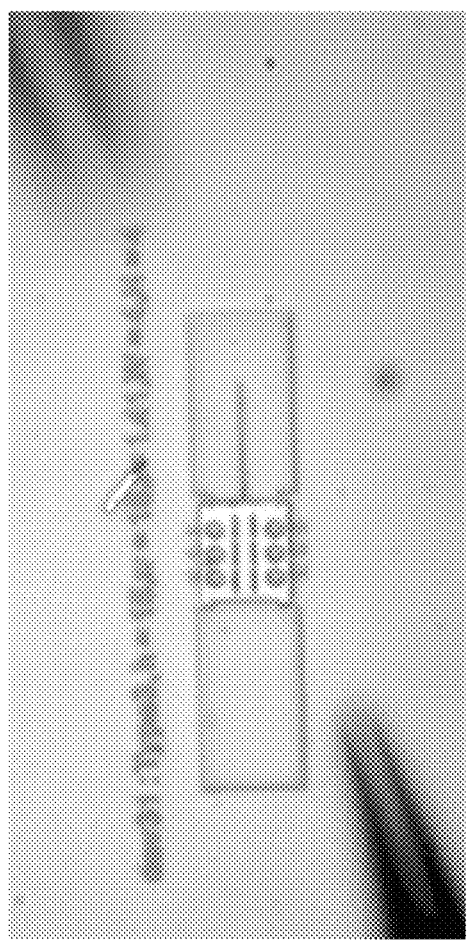
Figure 7A:
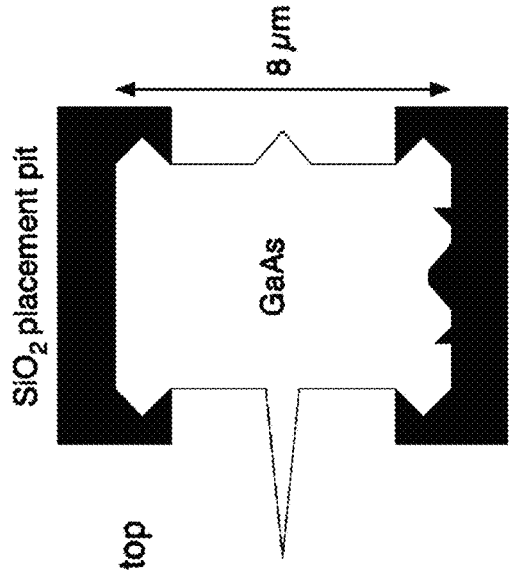

FIG. 7A illustrates a top view of a PIC socket with front and back lock-in features for a QMC.

FIG. 7B illustrates a top view of a PIC socket with front lock-in features for sliding a QMC into the PIC socket.

FIG. 7C illustrates a side view of a PIC socket and QMC showing PIC pillars to reduce friction during placement of the QMC in the PIC socket.

Figure 7D:
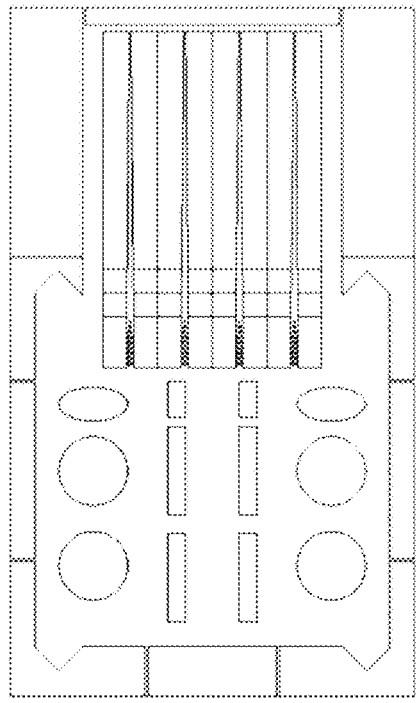

FIG. 7D illustrates a PIC socket with lock-in features scaled to hold a QMC with four parallel emitters.

FIG. 7E shows an optical micrograph of a successfully locked-in QMC in a PIC socket.

Figure 7H:
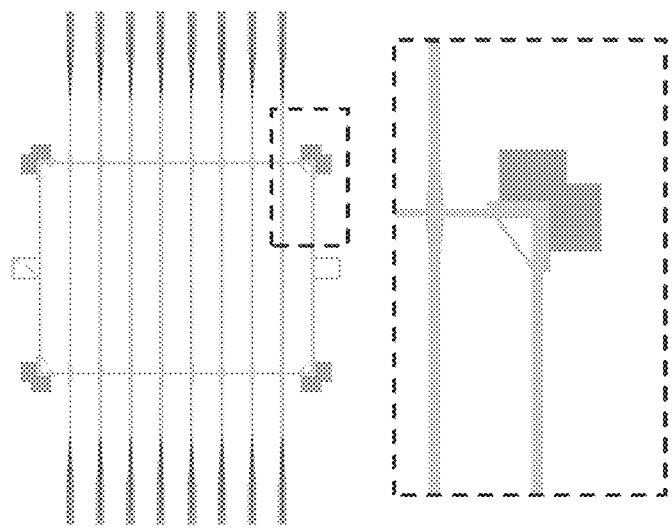
Figure 7G:
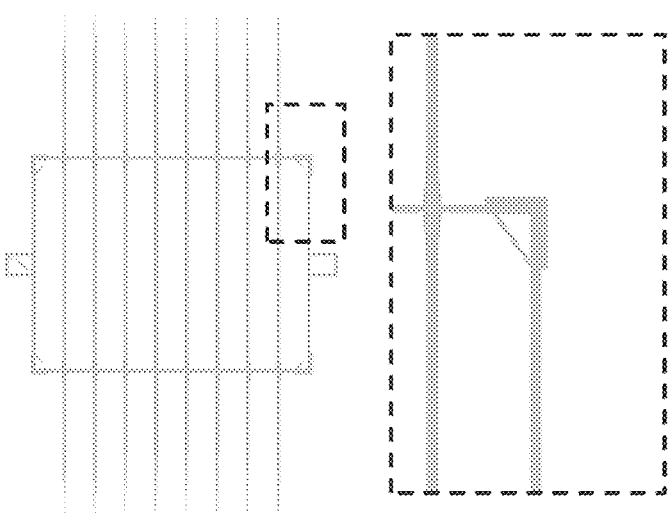
Figure 7F:
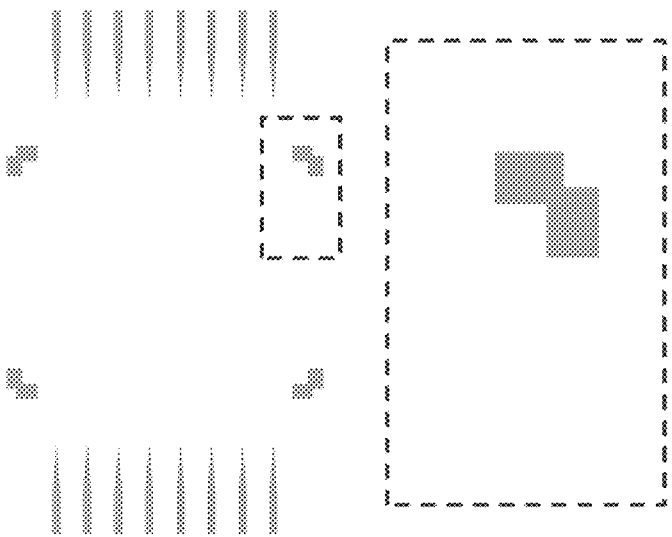

FIG. 7F shows tapered waveguide arrays and corner alignment features in a PIC socket for a QMC.

FIG. 7G shows tapered waveguide arrays and corner alignment features in a QMC.

FIG. 7H shows the QMC of FIG. 7G place in the PIC socket of FIG. 7F.

Figure 3B:
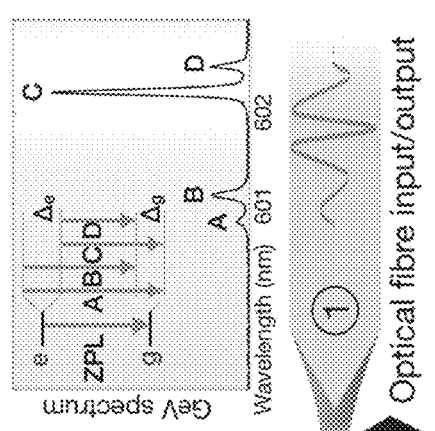
FIG. 3B illustrates the energy level and spectrum of a GeV center. Resonant excitation probes transition C, which is the brightest and narrowest line.
Figure 3A:
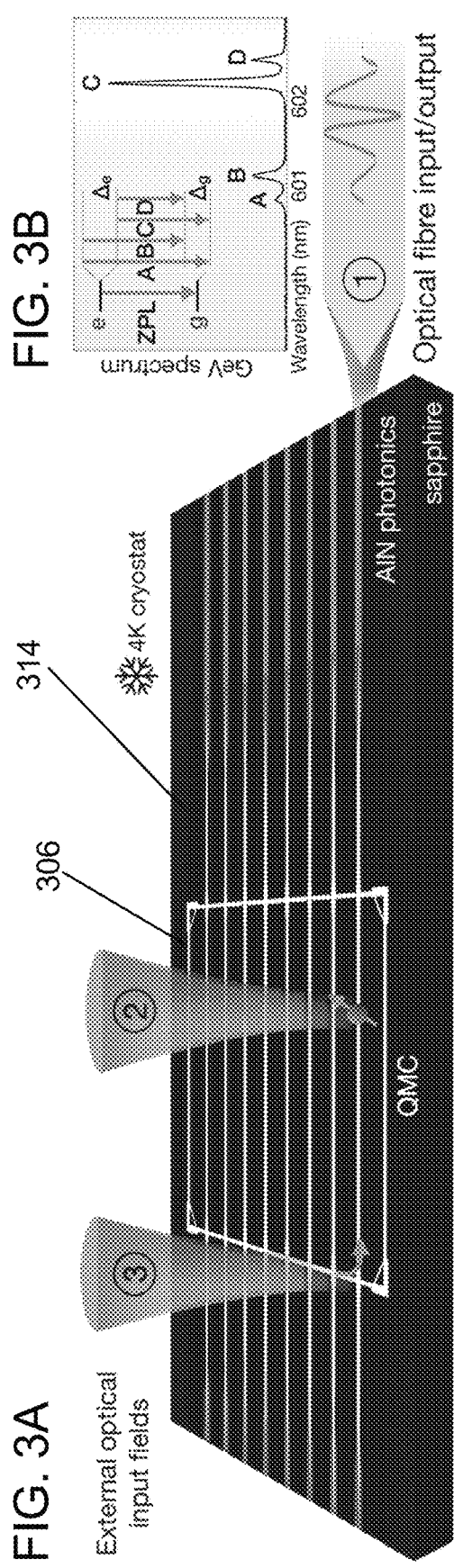
FIG. 3A illustrates an experimental QMC setup in a 4 K cryostat showing input and output optical interfaces ① (input/output), ② (input), and ③ (input).
Figure 3C:
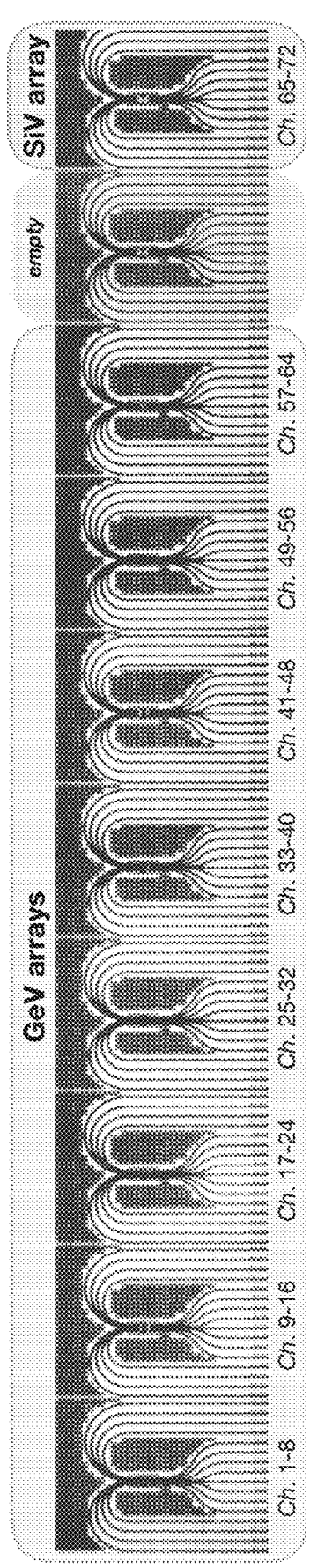
FIG. 3C is an optical image of ten QMC-populated micro-chiplet sockets containing GeV or SiV centers. The 'empty' module indicates a failed QMC placement.
Figure 8:
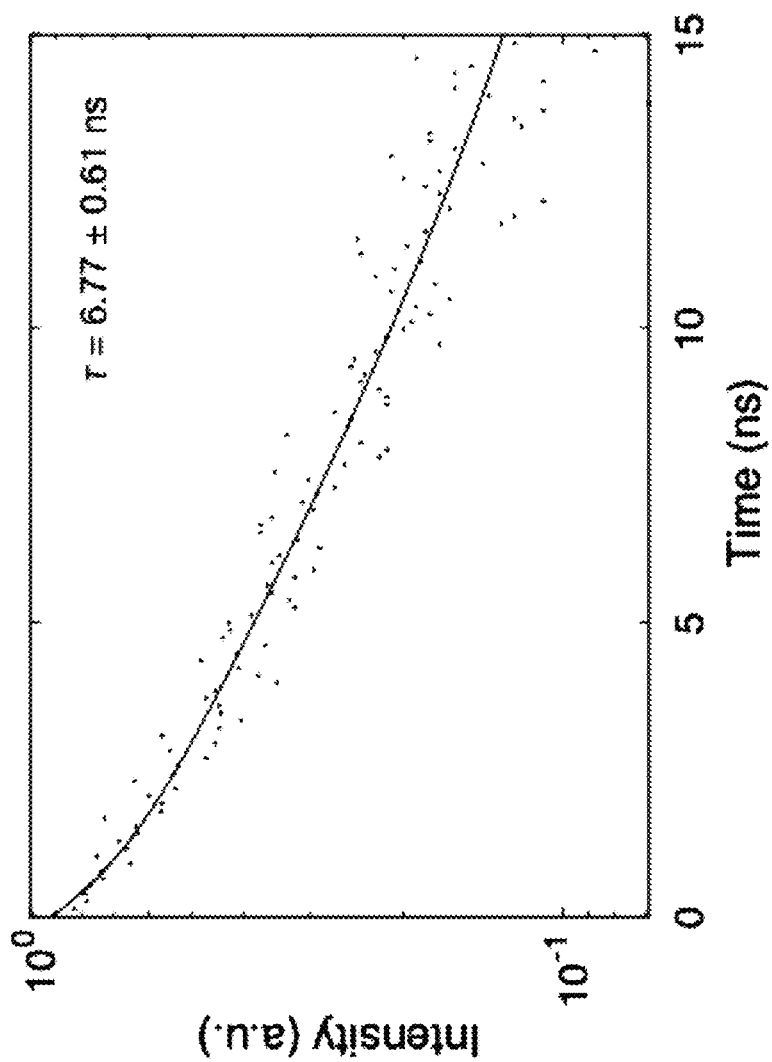

FIG. 8 is a plot illustrating fluorescence decay of the GeV in Channel 41 of the GeV array of FIG. 3C measured using time-correlated single photon counting (TCSPC).

Figure 9A:
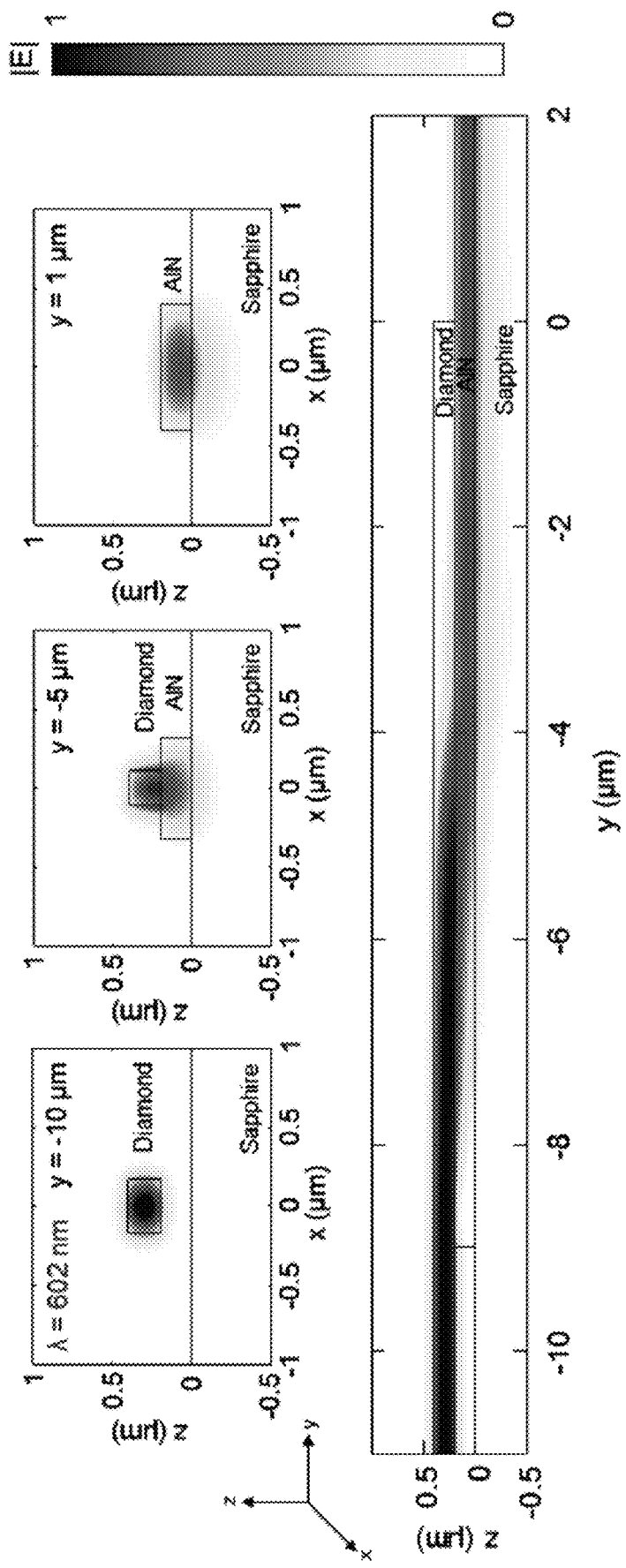

FIG. 9A illustrates a Finite-Difference Time-Domain (FDTD) simulation showing propagation of light from the diamond waveguide into the AlN waveguide for 602 nm wavelength corresponding to the GeV color center zero-phonon line (ZPL). Upper insets illustrate the electric field distribution at z-x cut at different propagation lengths (y=−10 μm, −5 μm, and 1 μm) and the lower inset shows a z-y cut.

Figure 9B:
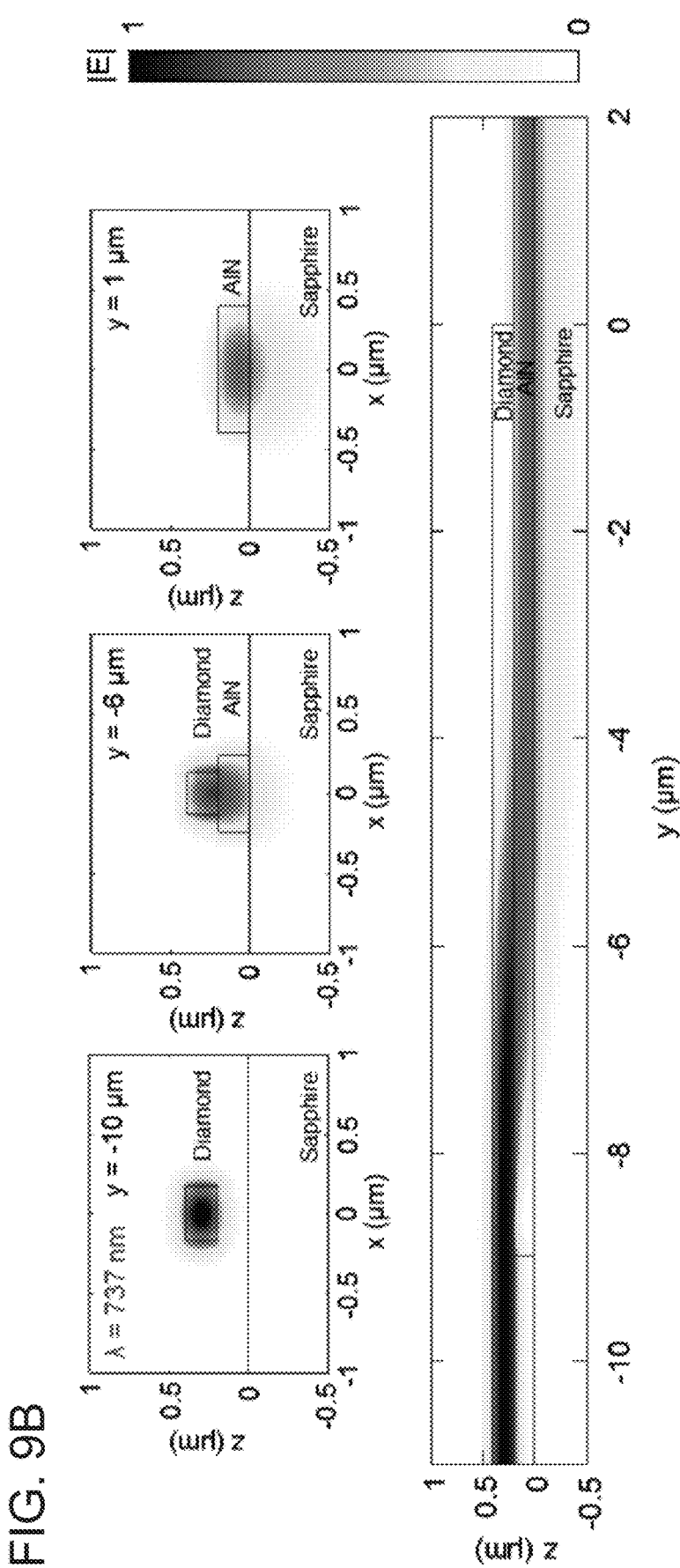

FIG. 9B illustrates a FDTD simulation showing propagation of light from the diamond waveguide into the AlN waveguide for 737 nm wavelength corresponding to the SiV color center ZPL. Upper insets illustrate the electric field distribution at a z-x cut at different propagation lengths (y=−10 μm, −5 μm, and 1 μm) while the lower inset shows a z-y cut.

FIG. 10A is a plot illustrating coupling efficiency of transverse electric (TE) mode light from the diamond waveguide into the AlN waveguide as a function of offset to the optimum alignment for ZPL of GeV centers at 602 nm.

FIG. 10B is a plot illustrating coupling efficiency of TE mode light from the diamond waveguide into the AlN waveguide as a function of offset to the optimum alignment for ZPL of SiV centers at 737 nm.

Figure 11A:
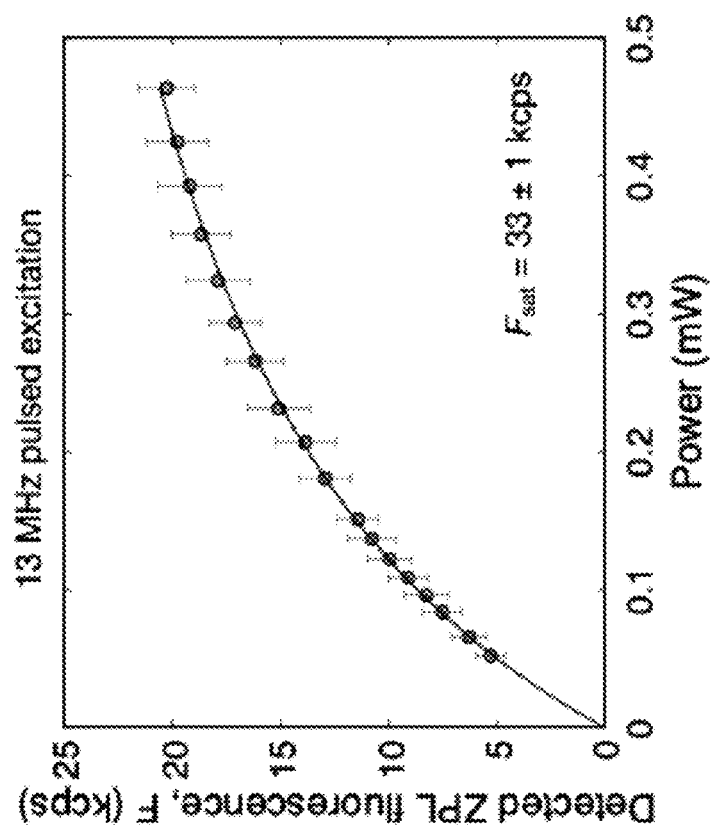

FIG. 11A is a plot illustrating saturation response of a single GeV center to continuous-wave 532 nm laser excitation.

Figure 11B:
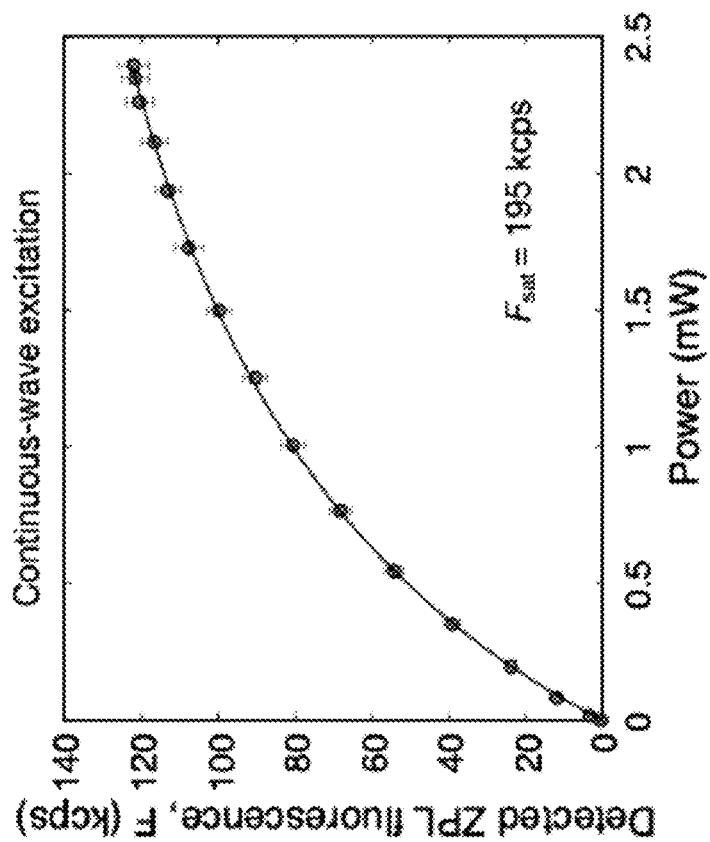

FIG. 11B is a plot illustrating saturation response of a single GeV center to pulsed laser excitation at 532 nm with a repetition rate of 13 MHz.

Figure 12A:
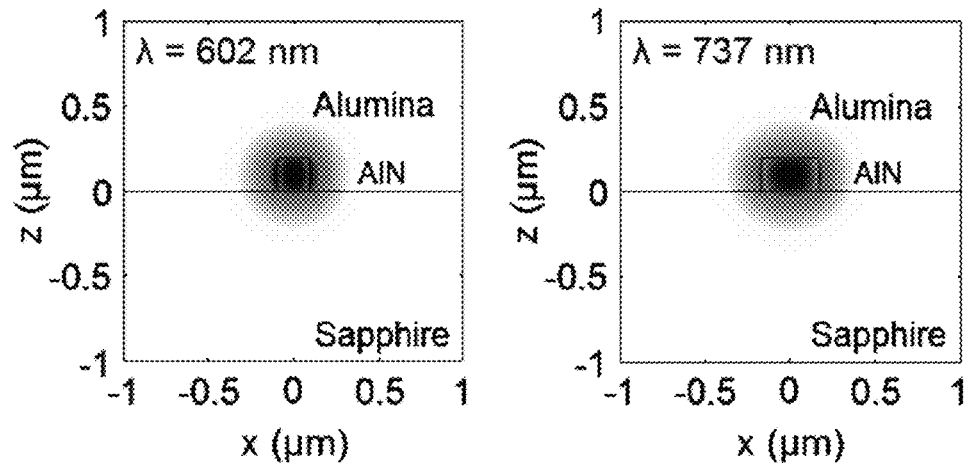

FIG. 12A illustrates an FDTD simulation showing the cross sectional ex-field component at the PIC facet for an optimized edge coupler for a lensed fiber at 602 nm (left) and 737 nm (right).

Figure 12B:
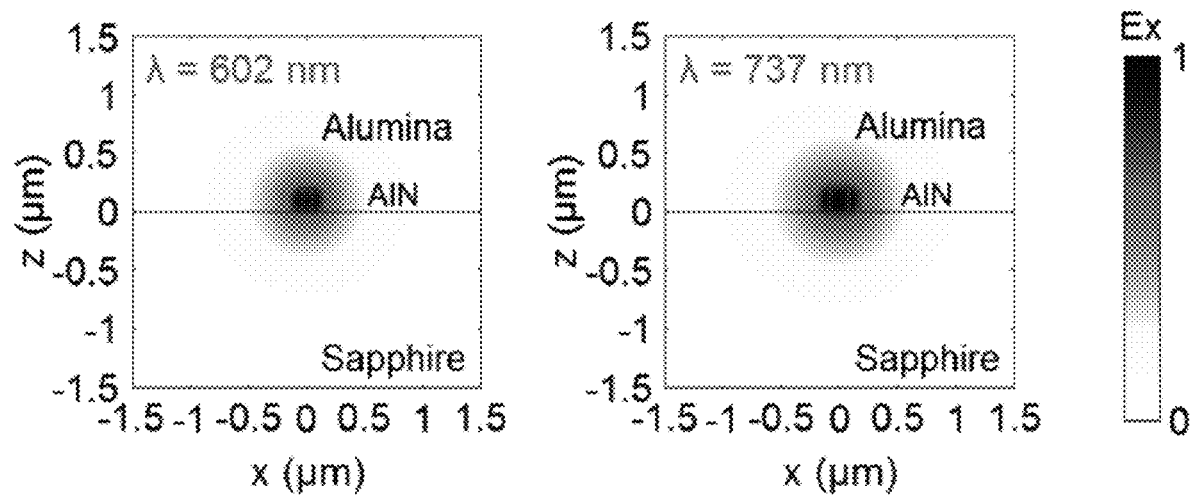

FIG. 12B illustrates an FDTD simulation showing the cross sectional ex-field component at the PIC facet for an optimized edge coupler for a high NA fiber at 602 nm (left) and 737 nm (right).

Figure 13A:
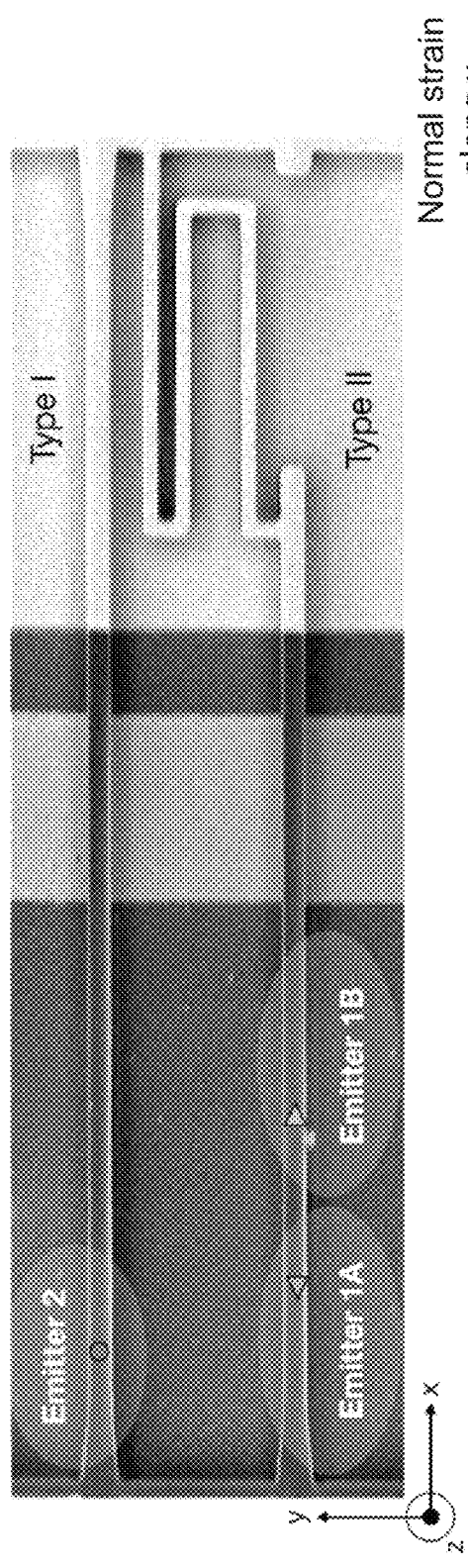

FIG. 13A is a SEM image of Type I and Type II waveguides implemented in a QMC.

Figure 13B:
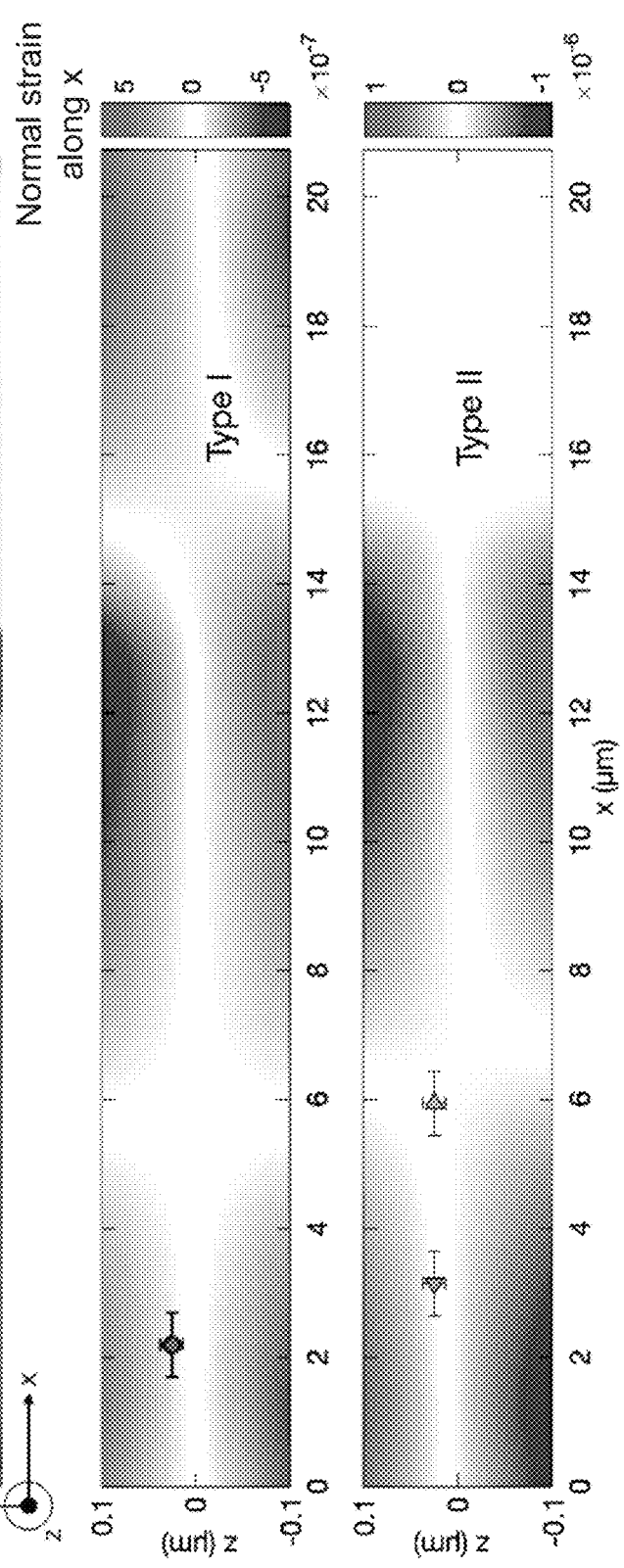

FIG. 13B illustrates strain distribution along the waveguides and emitters of FIG. 13A. Horizontal error bars indicate the lateral uncertainty in the position of emitters and vertical error bars indicate the ion implantation straggle.

Figure 14C:
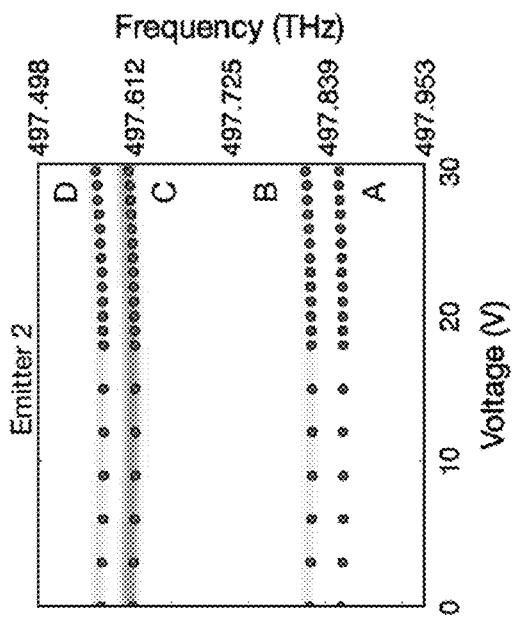
Figure 14B:
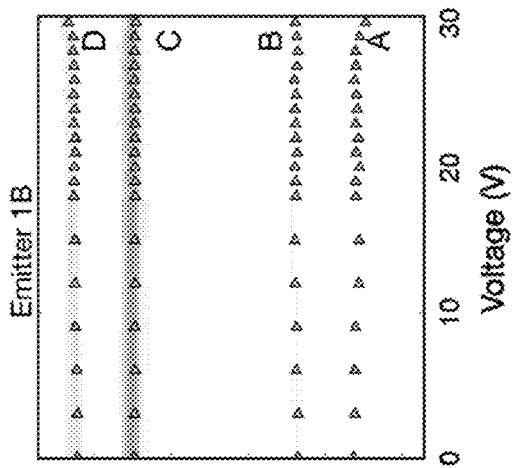
Figure 14A:
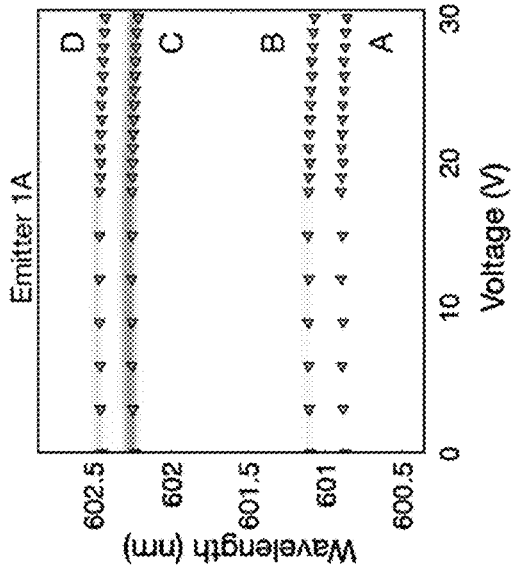

FIG. 14A illustrates the spectral shift of GeV centers in response to strain fields, and specifically shows strain spectroscopy results for Emitter 1A of FIG. 5C.

FIG. 14B illustrates the spectral shift of GeV centers in response to strain fields, and specifically shows strain spectroscopy results for Emitter 1B of FIG. 5C.

FIG. 14C illustrates the spectral shift of GeV centers in response to strain fields, and specifically shows strain spectroscopy results for Emitter 2 of FIG. 5C.

Figure 15:
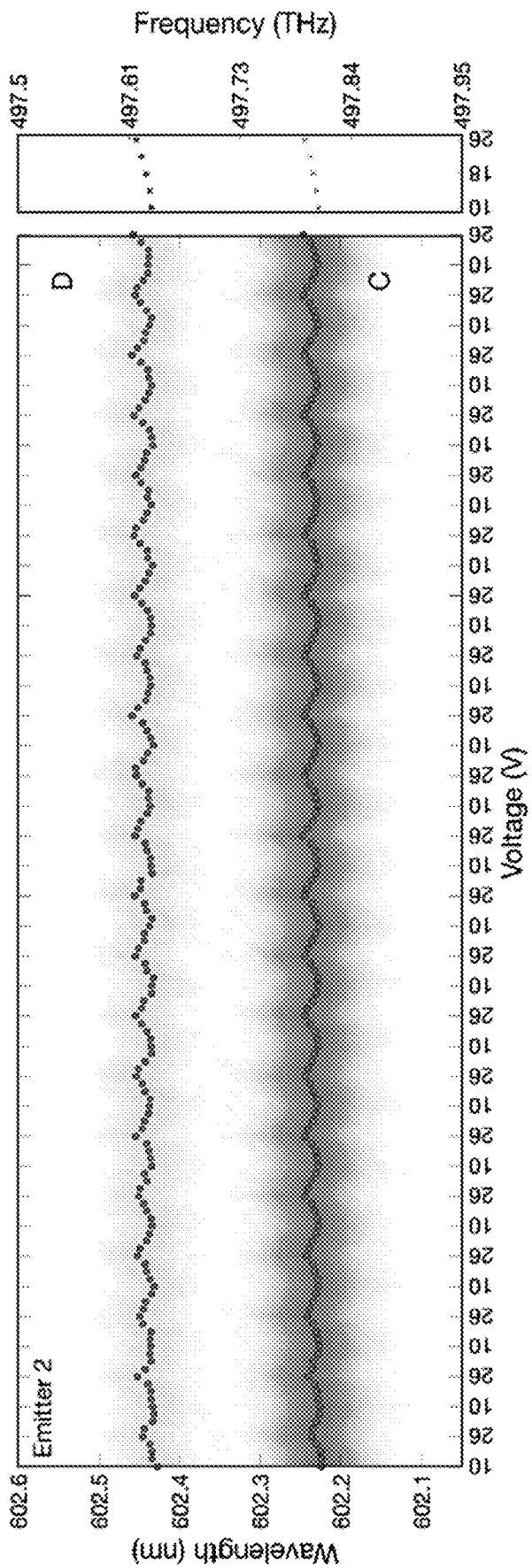

FIG. 15 is a plot illustrating the reproducible spectral shifts of Emitter 2 (a GeV center emitter) when applying a bias voltage between 10 V to 26 V.

FIG. 16A illustrates multiplexed quantum entanglement generation in a fiber that is broken into smaller segments connected by repeater nodes implemented in switchable photonic integrated circuits. By implementing entanglement swapping at the repeater nodes, it becomes possible to transfer entanglement over arbitrarily long distances.

FIG. 16B illustrates heralded entanglement generated by measuring two photons, which are respectively entanglement with spins at stations A and B, in an entanglement-basis (here, the Bell basis).

Figure 16C:
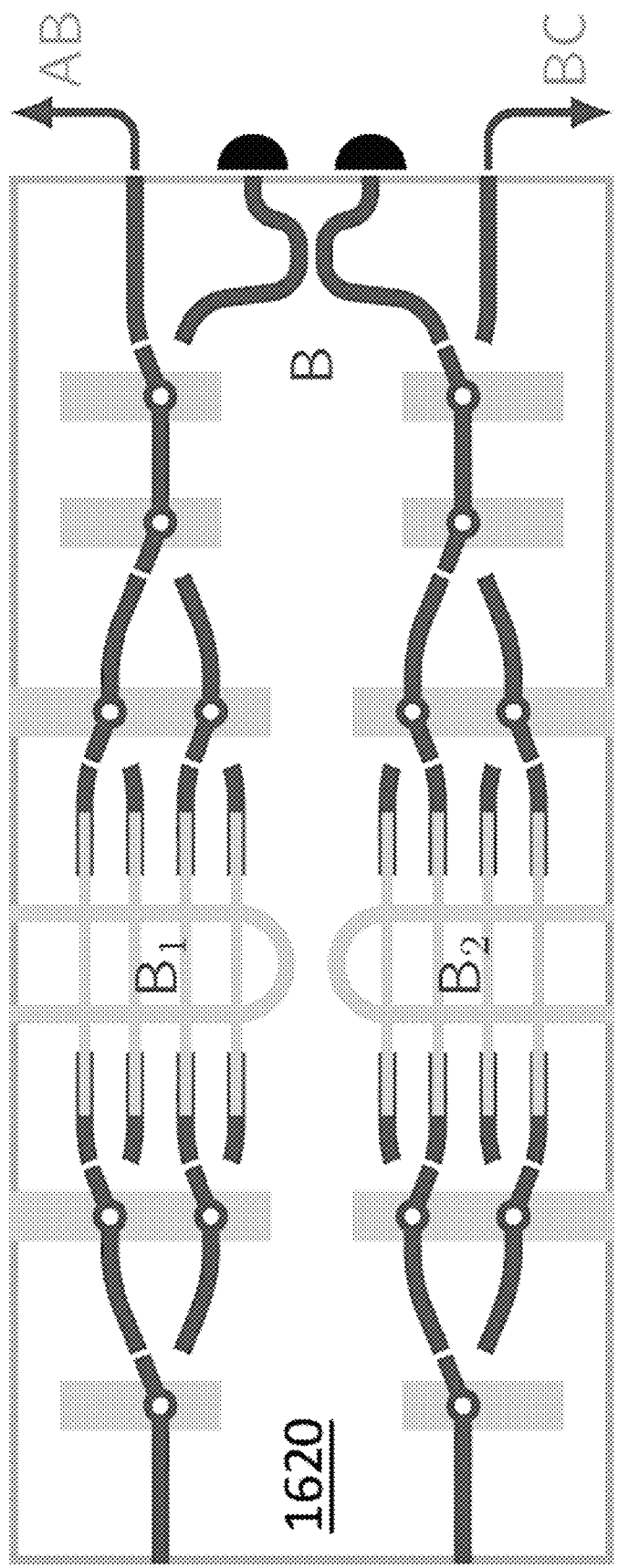

FIG. 16C illustrates a repeater node, which contains a number of quantum members (here, a total of eight) that are arranged in a photonic integrated circuit to facilitate switching between them into the quantum network.

Figure 16D:
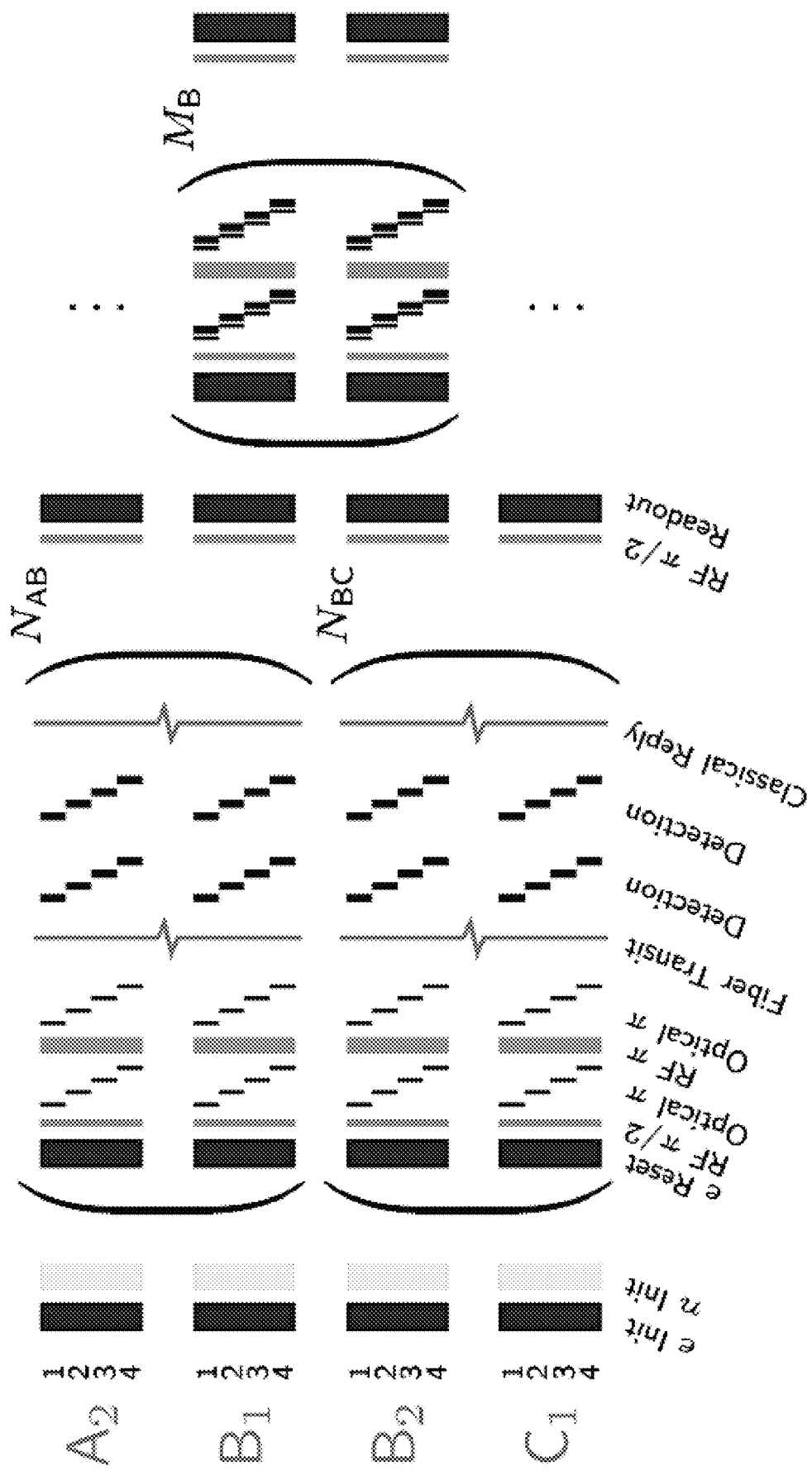

FIG. 16D shows a protocol for microwave (spin) and optical (photon) gates applied on the quantum memories in the fiber and repeater nodes of FIG. 16A.

DETAILED DESCRIPTION

QMC-PIC Assembly Process and Circuit

Figure 1:
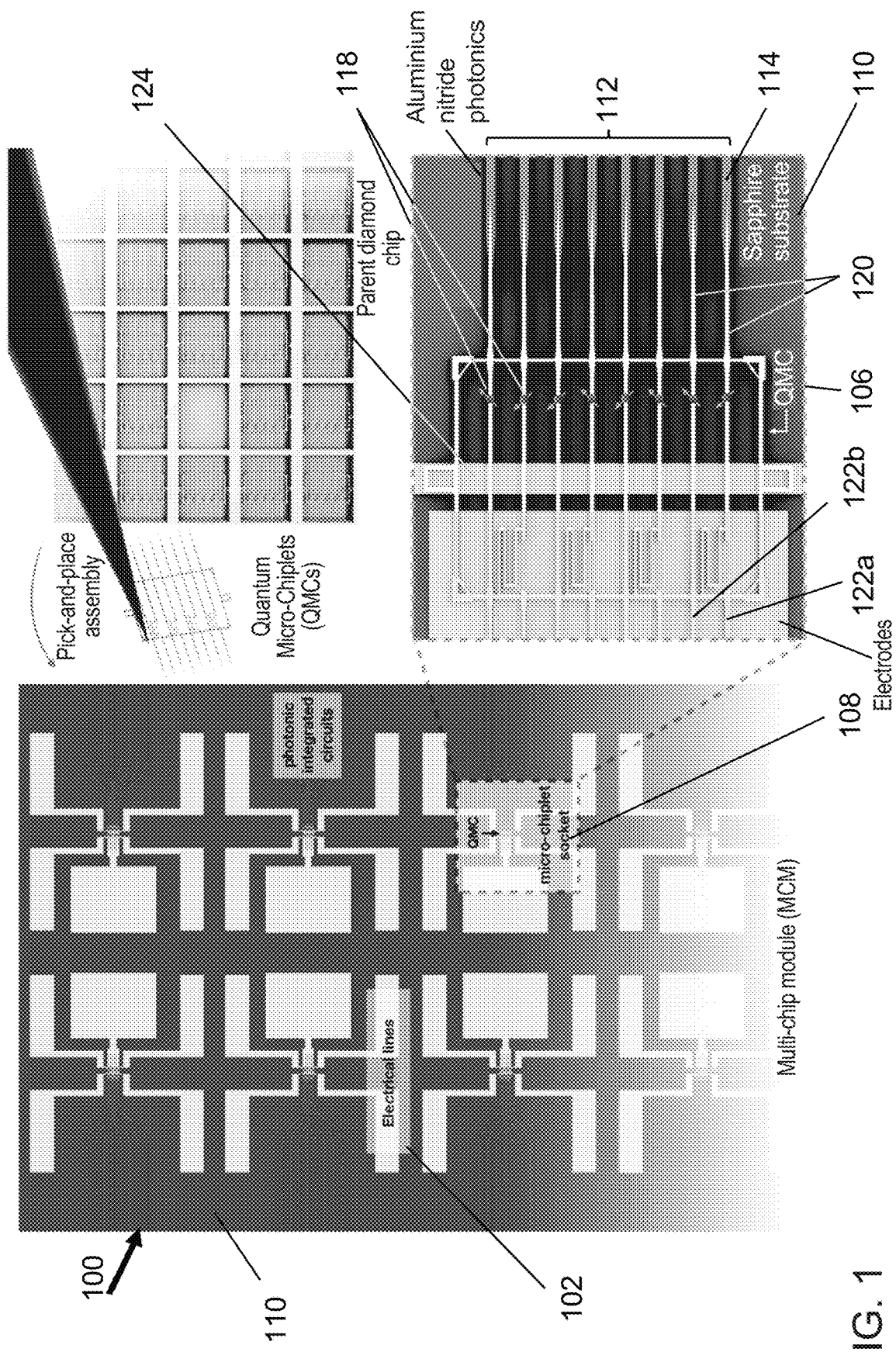

FIG. 1 illustrates an example PIC 100 (also referred as a multi-chip module, or MCM). The PIC 100 includes a substrate 110 on which electrical wires/lines 102 are formed, deposited, and/or otherwise integrated. The substrate 110 can be made of sapphire, lithium niobate, aluminum nitride, silicon nitride, silicon, silica, gallium arsenide, and/or indium phosphide. The PIC 100 includes one or more arrays 112 of waveguides 114 that are integrated with the substrate 110. For examples, the waveguides 114 can be formed in a single-crystal AlN layer of the PIC 100 that has low auto-fluorescence and loss in the visible spectrum. They may be arrayed at a minimum pitch of 2-3 μm, with up to 1000 emitters over 3 mm of chip space.

The PIC 100 incudes one or more sockets 108 formed in the substrate 110. Each socket 108 can receive a corresponding QMC 106, which may be about 10 μm$^2$ to about 10,000 μm$^2$ in area. Each socket 108 has optical and electrical connections, in the form of tapered waveguides 114 and electrical contacts at the ends of the electrical wires 102, respectively, that connect the a properly placed QMC 106. And each socket 108 may have passive alignment features, including those described below, that make alignment easier.

As detailed below, a suitable QMC 106 can be pre-screened and subsequently transferred into the socket 108 using a pick-and-place process. One or more alignment markers or features (not shown) such as visual indicia, mating connectors, etc. can be formed on the QMC 116, on the substrate 110, or both, to improve the chances of alignment. The QMC 106 can be suspended above the substrate 110 on pedestals as illustrated and described with respect to FIGS. 2A-2G, 5A, and 5B.

Each QMC 106 can be an integrated quantum emitter chip with a substrate (e.g., diamond; III/V materials, such as gallium arsenide or indium phosphide; or two-dimensional (2D) materials, such as hBN or WSe$_2$) that hosts 50-1000 quantum emitters 118 (e.g., quantum dots, defect centers, or 2D material emitters). Here, the QMC 106 is made in diamond with suitable defect centers (e.g., germanium, silicon, nitrogen, and/or tin vacancies). While the emitters 118 are illustrated as being regularly spaced, the spacing between any pair of emitters may be regular or irregular (e.g., have different spacing) relative to other pairs of emitters on the QMC 106. Further, one or more of the slots in which the emitters 118 are supposed to be formed may be empty or filled with an inoperative emitter.

The QMC 106 also includes its own set/array of waveguides 120 that are in optical communication with the emitters 118 and that, upon placement, align with the waveguides 114 (i.e., each waveguide 120 aligns with a corresponding waveguide 114). In this manner, optical continuity exists between each emitter 118 of the QMC 106 and the corresponding waveguide 120 of the PIC 104 via one of the waveguides 120. As illustrated in FIGS. 1 and 2G, the ends of the waveguides 114, 120 may be tapered adiabatically for more efficient transfer of light from one to the other. The light transfer between the waveguides 114, 120 may be adiabatic. (The waveguides 114 and 120 may also be edge- or butt-coupled.)

While FIG. 1 illustrates a 1-1-1 correspondence between the emitters 118, the waveguides 120, and the waveguides 114, this need not always be the case. For example, a single waveguide 120 may be optically coupled to two or more of the emitters 118. In such cases, additional optical components may be employed to prevent optical contamination such as, for example, a reflector within that waveguide 120 that reflects any photons from one of the quantum emitters away from the other quantum emitter. This reflector can be implemented as a one- or two-dimensional photonic crystal. Alternatively, at low temperature (<50 Kelvin), each emitter may be addressed individually with a laser that is resonant with one and only one emitter.

The QMC 106 also includes an array of electrodes 122a and 122b, that each interface with a corresponding electrical wire 102. Such wired connectivity can be used, for example, to deliver microwave signals, radio-frequency signals, and/or the like, to the quantum emitters 118 to drive the spin transition of the emitters. Further, as explained in greater detail with respect to FIGS. 5A and 5B, when the QMC 106 is suspended above the substrate 110, a bias voltage can be applied between the electrode 122b and an electrode 124 formed on the substrate. This bias voltage can induce a strain in the QMC 106, which in turn can result in tuning of an emission wavelength of at least one of the emitters 118 in response to optical and/or microwave excitation. Each emitter's emission wavelength can also be tuned by applying an electric field directly to the emitter 118 and tuning the emitter via the Stark effect.

Additional optical components may be formed on the substrate 110 for any suitable processing of the light received via one of the waveguides 114. For example, one or more on-chip optical switches, directional couplers, etc. formed on the substrate 110 and coupled to the waveguide 114 may be used to split and/or redirect the light from the waveguide.

QMC Fabrication and Coupling

An example approach to the fabrication and high-yield coupling of emitters into a diamond QMC, such as the QMC 106 or any other QMC described herein, is further described here. Negatively charged GeV and SiV centers can be used because of their stable optical and spin properties in nanophotonic devices. The process begins with focused ion beam (FIB) implantation of $Ge^+$ and $Si^+$ into a 1 μm pitch square array in a single-crystal diamond substrate, followed by high temperature annealing (see Example 1). This process generates spots of tightly localized GeV centers (depth of ~74 nm, vertical straggle ~12 nm, lateral FWHM distribution ~40 nm) and SiV centers (~113 nm, ~19 nm, ~50 nm), which are then registered relative to pre-fabricated alignment markers by photoluminescence (PL) microscopy. The QMCs are fabricated over the emitter arrays using a combination of electron-beam lithography (EBL) and quasi-isotropic etching.

Figure 2A:
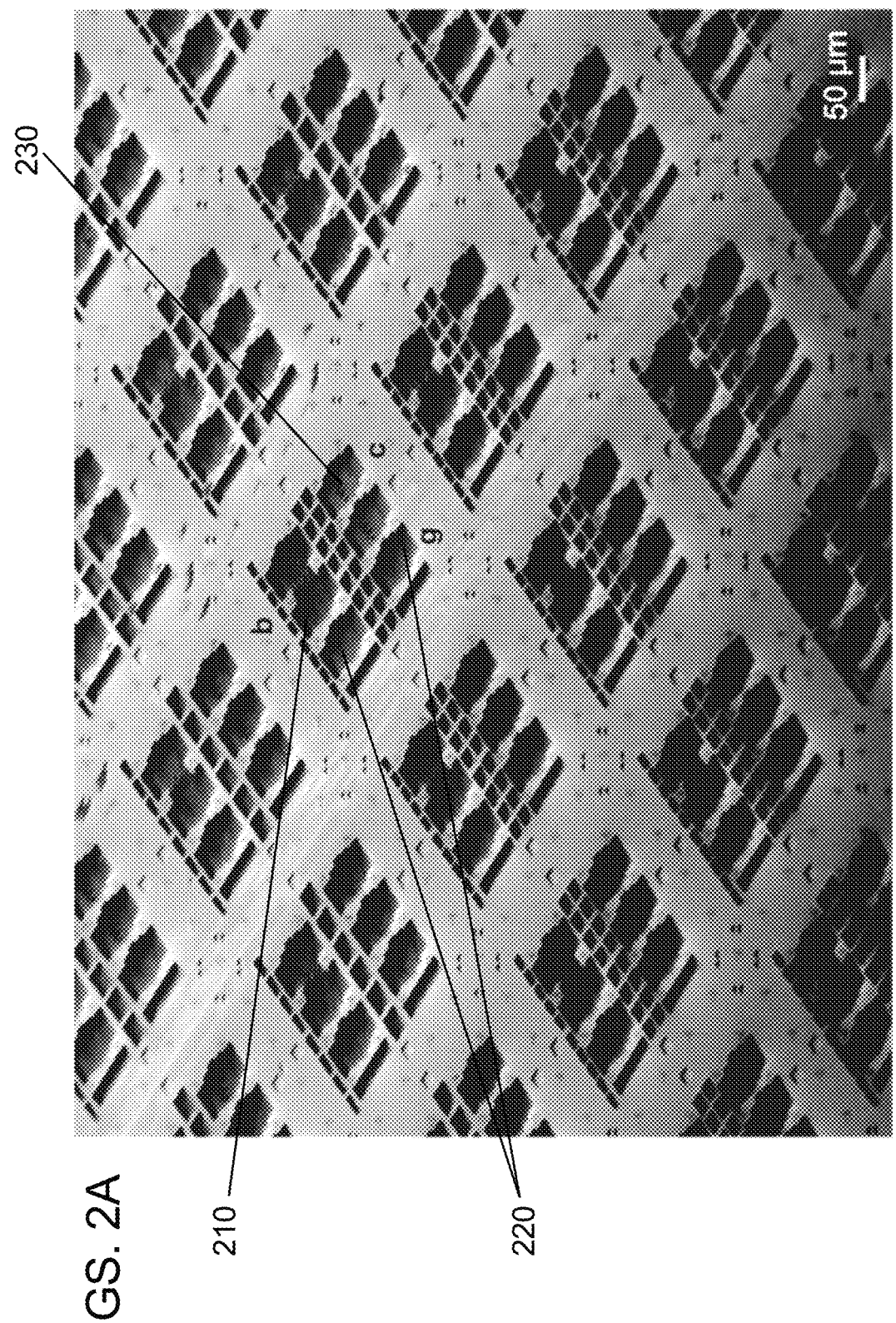
FIG. 2A is a scanning electron microscope (SEM) image of a parent diamond chip containing over 500 micro-chiplets for heterogeneous integration into a PIC.
Figure 2C:
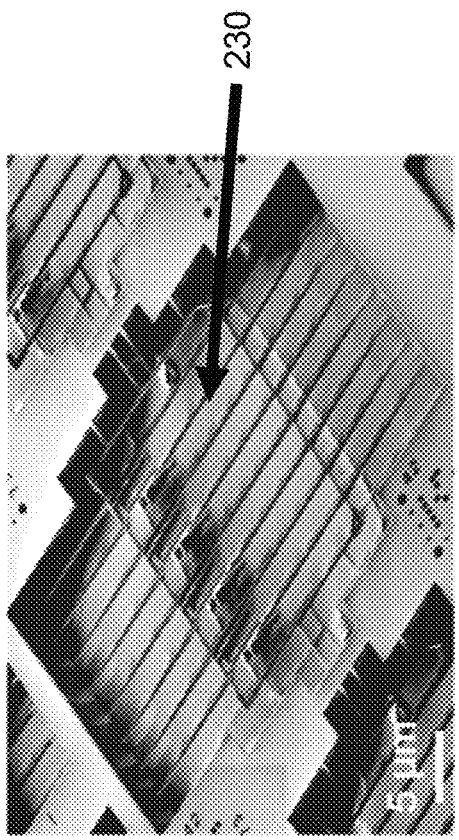
FIG. 2C is an SEM image of an 8-channel QMC with varying mechanical beam rigidity.
Figure 2B:
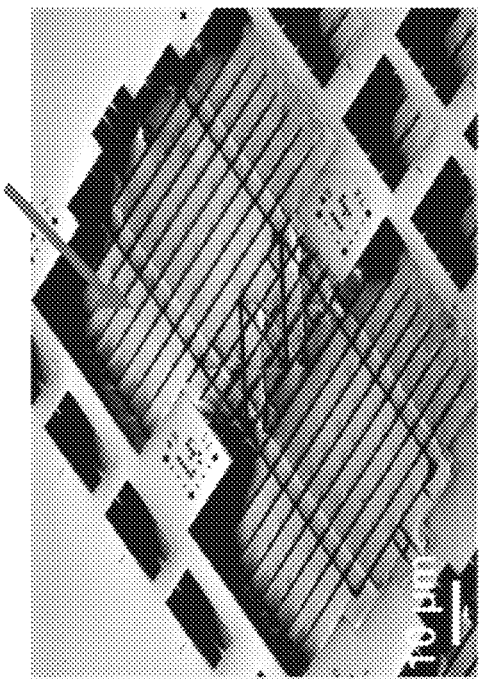
FIG. 2B is an SEM image of a 16-channel QMC.
Figure 2E:
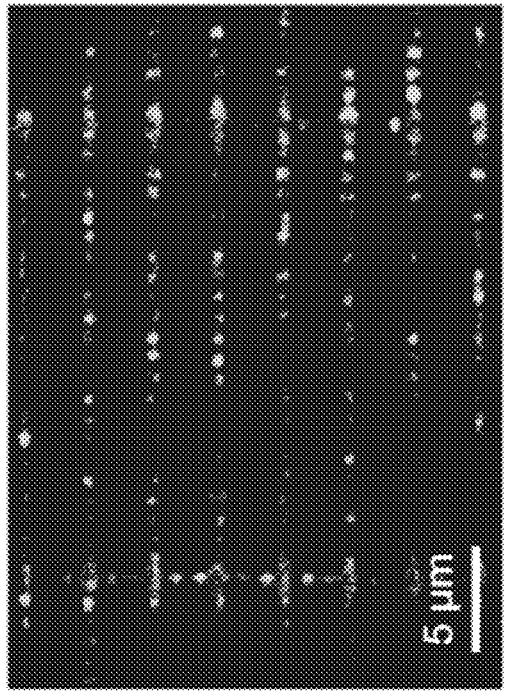
FIG. 2E illustrates a PL map of silicon-vacancy (SiV) centers (bright spots) in a defect-free 8-channel QMC.
Figure 2D:
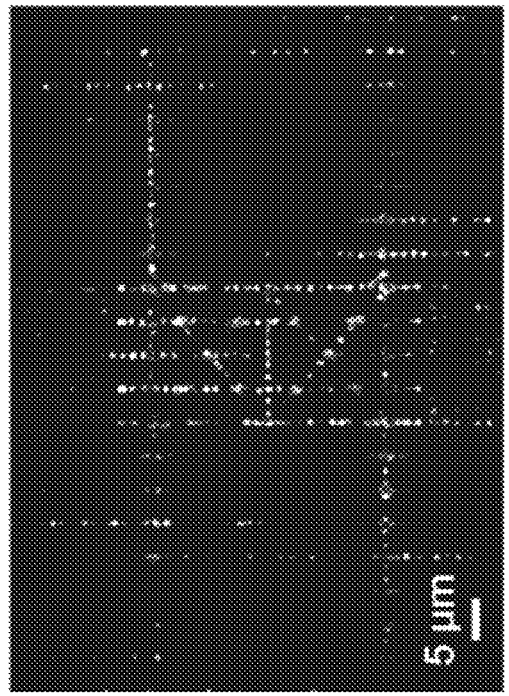
FIG. 2D illustrates a photoluminescence (PL) map of germanium-vacancy (GeV) centers (bright spots) in a 16-channel QMC.

FIG. 2A shows scanning electron micrographs (SEMs) of various suspended chiplets containing 8- or 16-channel waveguide arrays connected by diamond 'trusses.' More specifically, these chiplets include a 16-channel QMC 206a, as seen in the close-up SEM in FIG. 2B; an 8-channel QMC 206b with varying mechanical beam rigidity for testing strain tuning (described below), as shown in FIG. 2C; and a pair of 8-channel QMCs 106, also shown in FIG. 2G. Structurally, much larger arrays are fabricable and integrable: QMCs were successfully transferred with as many as 64 waveguide components. FIGS. 2D and 2E are PL maps of GeV centers in the 16-channel QMC 206a and of SiV centers in the 8-channel QMC 106, respectively. Despite a misalignment between the FIB mask and the QMC patterns, the PL scans show that 40% of 8-channel QMCs are defect-free, i.e., they have more than one stable color center per waveguide as shown in FIG. 2E. The defect-free yield of the 16-channel QMCs can be lower as these can be more susceptible to misalignment. The reduction in misalignment would permit the use of larger-channel QMCs, such as 16-channel, 64-channel, or 1000-channel QMCs, with QMC size limited by the size of the parent chip.

Figure 2F:
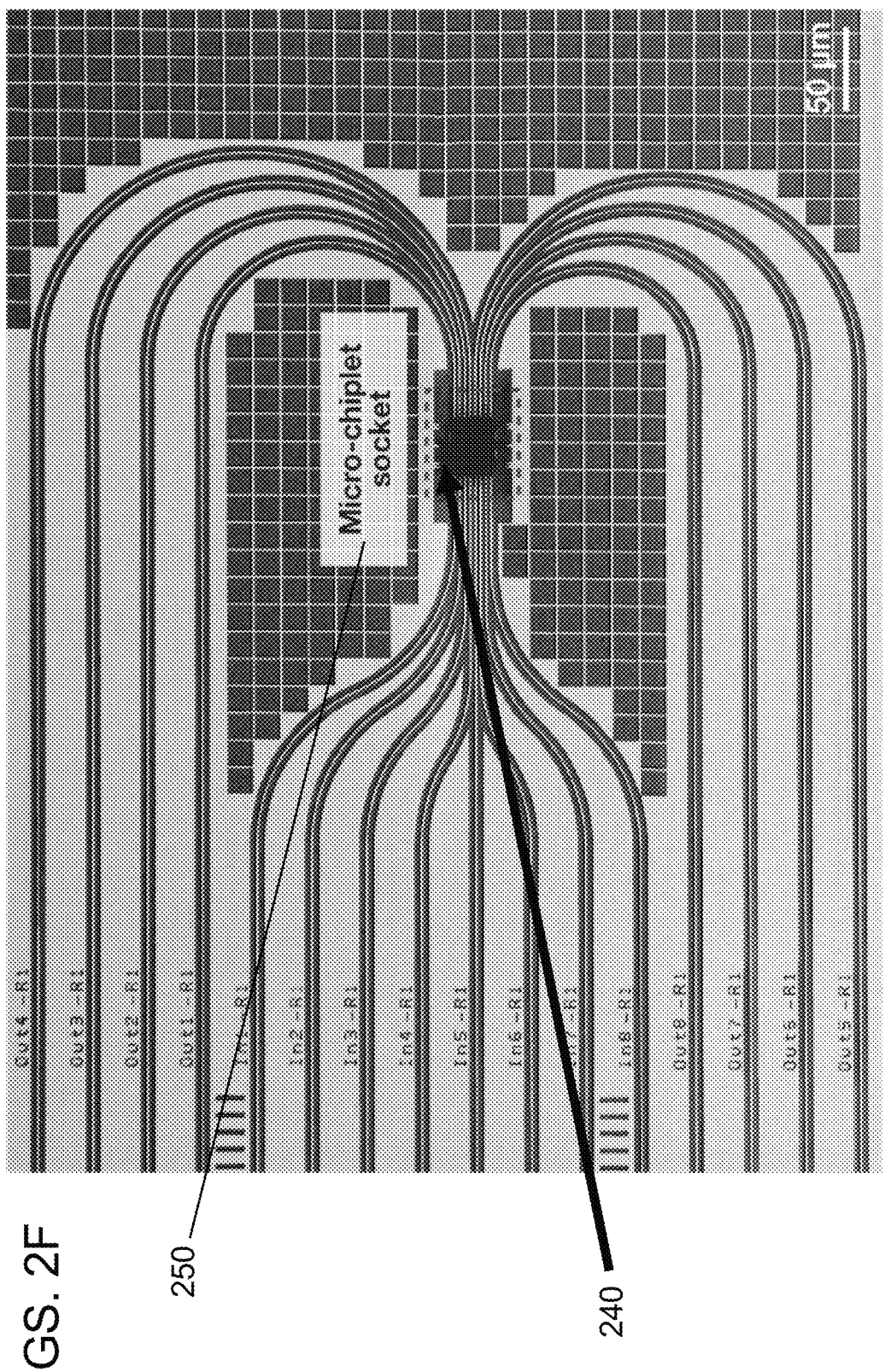
FIG. 2F is an SEM image of an aluminum nitride (AlN)-on-sapphire integrated photonics module that interfaces with the diamond QMC placed in the chiplet socket.
Figure 2G:
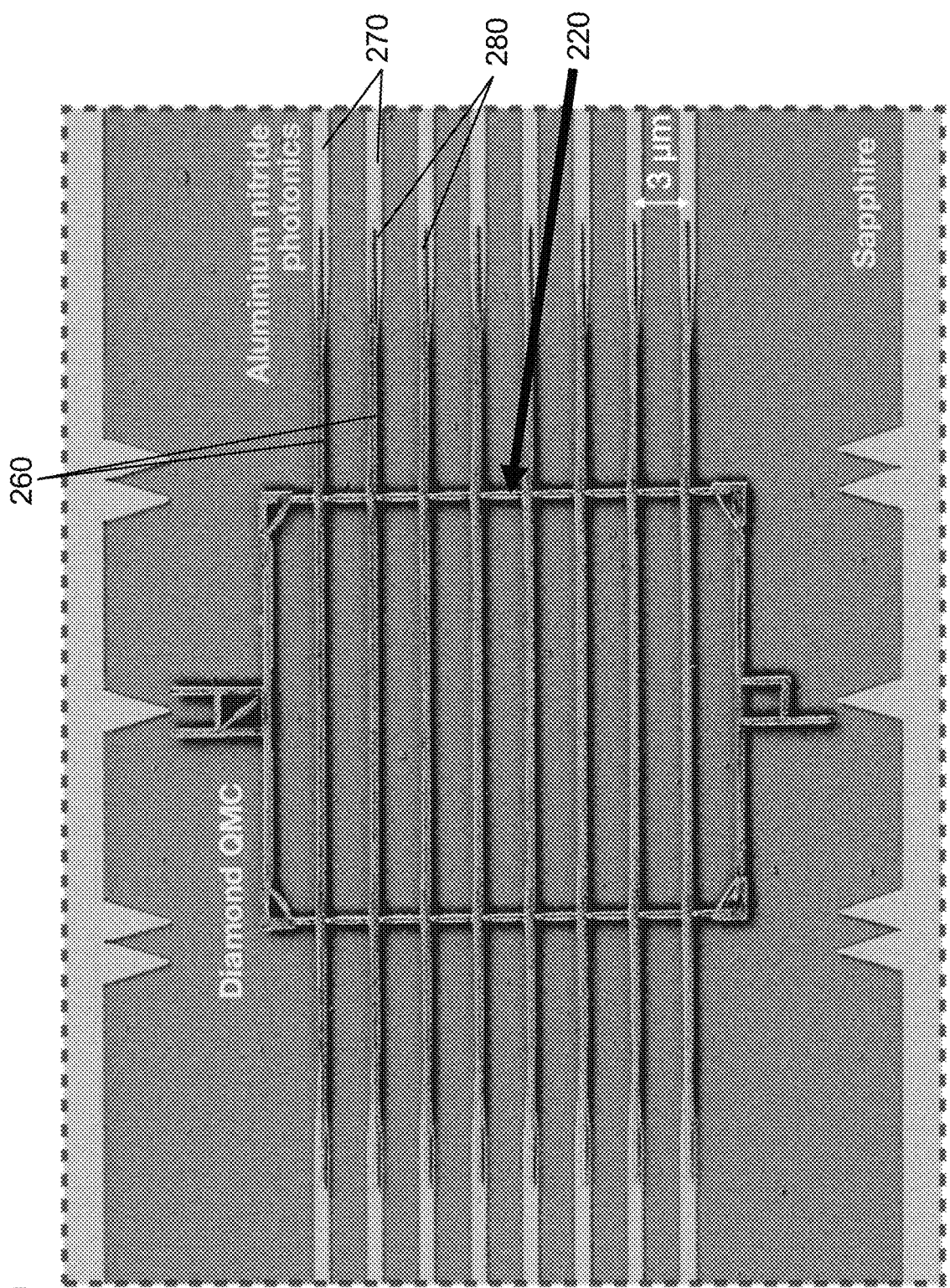
FIG. 2G is a close-up SEM image of the diamond QMC and AlN photonic interfaces.

FIG. 2F shows one of ten micro-chiplet sockets connecting 8 input and 8 output waveguide arrays to an 8-channel QMC. The PIC is on a wafer of single-crystal AlN on a sapphire substrate using EBL and chlorine reactive ion etching. Using piezo-controlled micro-manipulators, the QMCs are transferred into the micro-chiplet sockets (e.g., the socket 108) with a success rate of 90%. The diamond waveguides (width 340 nm, height 200 nm), which can be akin to the waveguides 120 transfer light into the AlN waveguides (width 800 nm, height 200 nm), which can be akin to the waveguides 114, through inverse tapered sections with simulated efficiency of 97% (98%) at 602 nm (737 nm) wavelength. The SEM of an assembled device in FIG. 2G shows a transverse placement error of (38±16) nm. For such typical errors, simulations indicate a drop in coupling efficiency by 10% or 0.46 dB. The transfer of the QMCs can be substantially easier than for individual waveguides due to its rigidity and many alignment features.

QMC Characterization after Integration

Figure 3D:
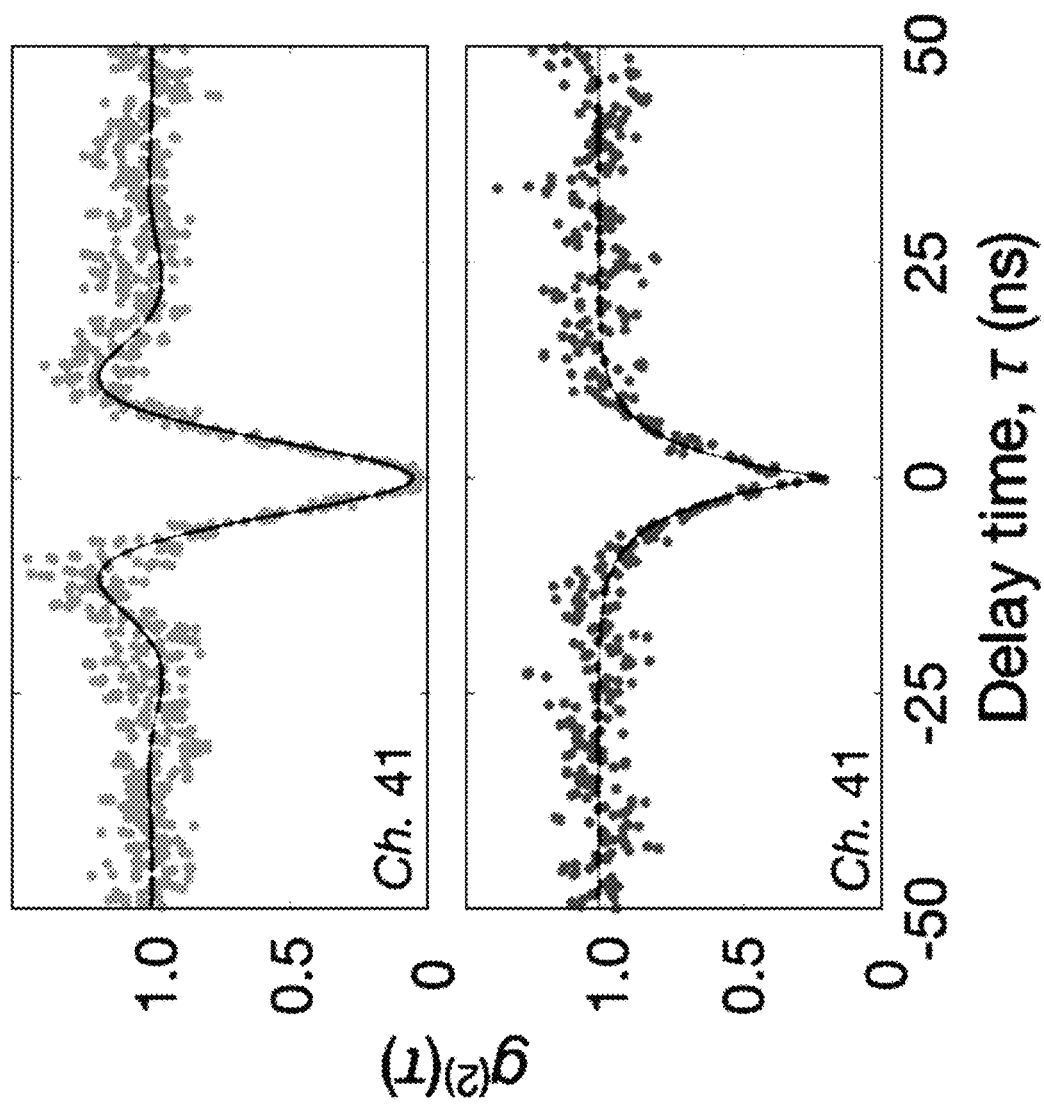
FIG. 3D shows plots of auto-correlation measurements of a single GeV in Channel 41 of the GeV array of FIG. 3C under off-resonant 2 mW, 532 nm excitation (bottom plot) and under resonant 10 nW, 602 nm excitation (top plot).
Figure 3E:
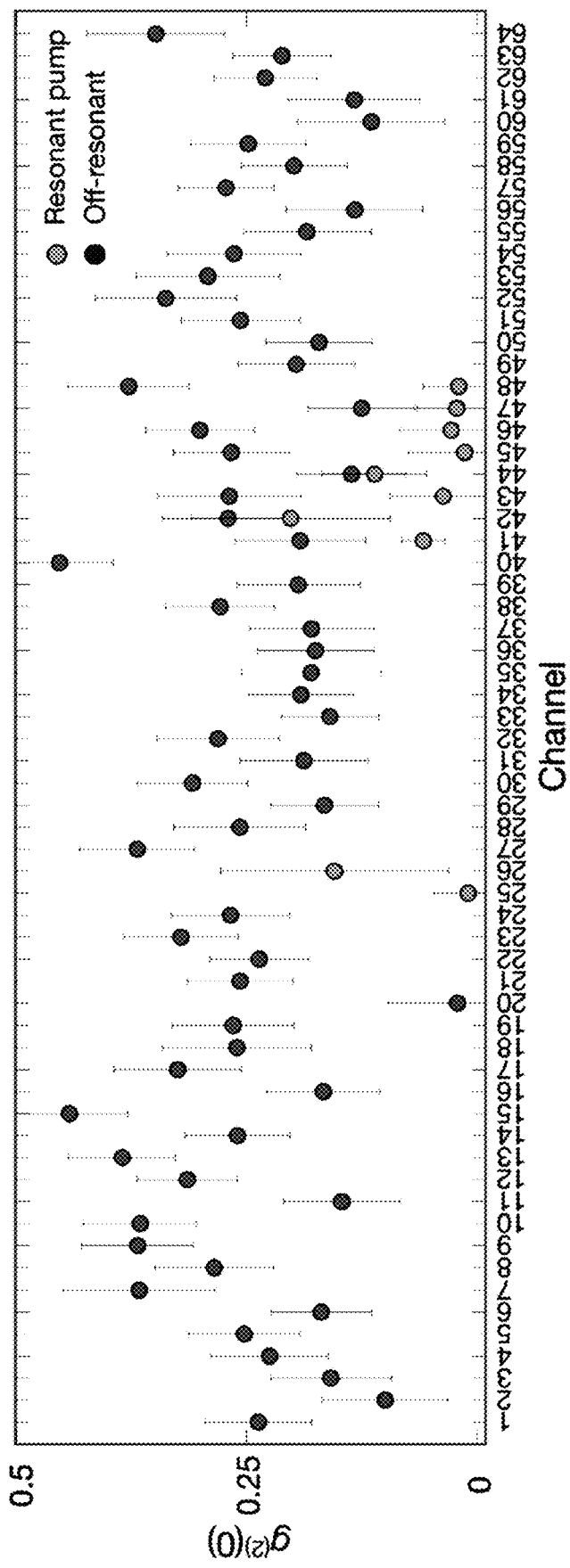
FIG. 3E illustrates observation of waveguide-coupled single photons from every GeV channel in the PIC shown in FIG. 3C.

FIGS. 3A-3H illustrate experiments were performed on an example QMC 306 on a PIC in a closed-cycle cryostat with a base temperature below 4 K. An optical fiber labeled ① couples pump light (fluorescence) to (from) the QMC 106 via the AlN waveguides 314 as shown in FIG. 3A. A microscope objective (not shown) also provides optical access to the QMC, e.g., to a color center (optical interface ②) or a scattering site (③). FIG. 3B shows the energy level and emission spectrum of a single GeV when pumped through ② and collected through ①. Off-resonant excitation using 532 nm light with off-chip pump filtering in this configuration enables the rapid identification of single emitters (indicated by a photon autocorrelation function $g^{(2)}(0)$ <0.5). The bottom panel of FIG. 3D shows a typical photon antibunching ($g^{(2)}(0)=0.19(7)$) from a single GeV center (Channel 41) pumped near saturation, without background or detector jitter correction. (Numbers in parentheses represent one standard deviation error.) Under the resonant excitation (10 nW, 602 nm) of transition C (see FIG. 3B) of the zero-phonon line (ZPL), the photon purity improves to $g^{(2)}(0)=0.06(2)$ (top panel of FIG. 3D). By repeated measurements (pump through ② and collection through ①), single GeV emitters are identified in all integrated QMC waveguides as summarized by their photon statistics in FIG. 3E.

Figure 3F:
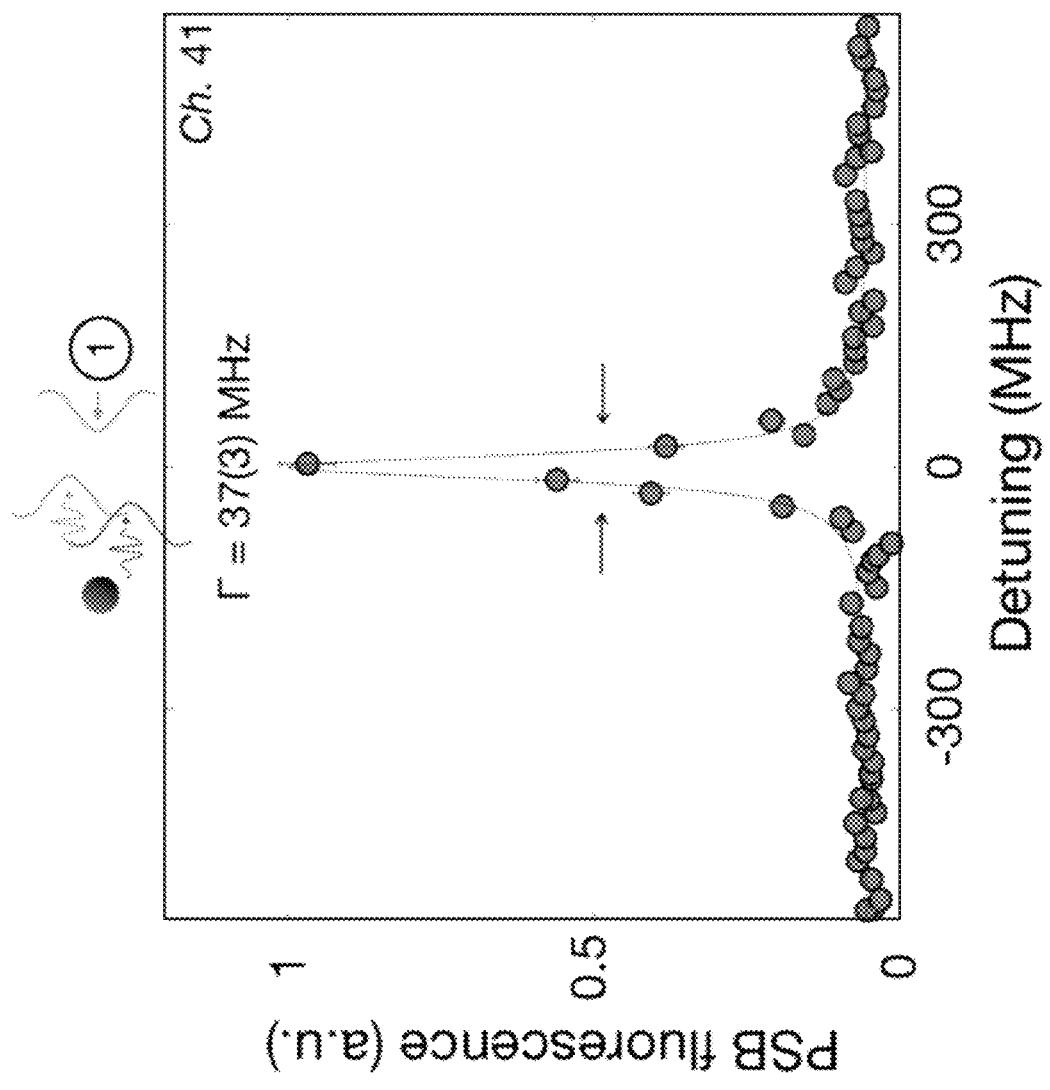
FIG. 3F is a plot of the photoluminescence excitation (PLE) spectrum (full-width half-maximum (FWHM) linewidth $\Gamma=37(3)$ MHz) of a single GeV in Channel 41 of the GeV array of FIG. 3C with all-fiber excitation and detection routed on-chip via ①.

Next, the optical coherence of the GeV was investigated using all-fiber spectroscopy. FIG. 3F shows the photoluminescence excitation (PLE) spectrum of the Channel 41 GeV as a resonant laser was scanned across its ZPL (transition C) with both excitation and detection through the fiber interface ①. The measured linewidth of $\Gamma=\Gamma_0+2\Gamma_d=37$ MHz (3 MHz fit uncertainty) is near the lifetime limit $\Gamma_0=\frac{1}{2\pi\tau}=24(2)$ MHz, obtained from the excited state lifetime τ.

Figure 3G:
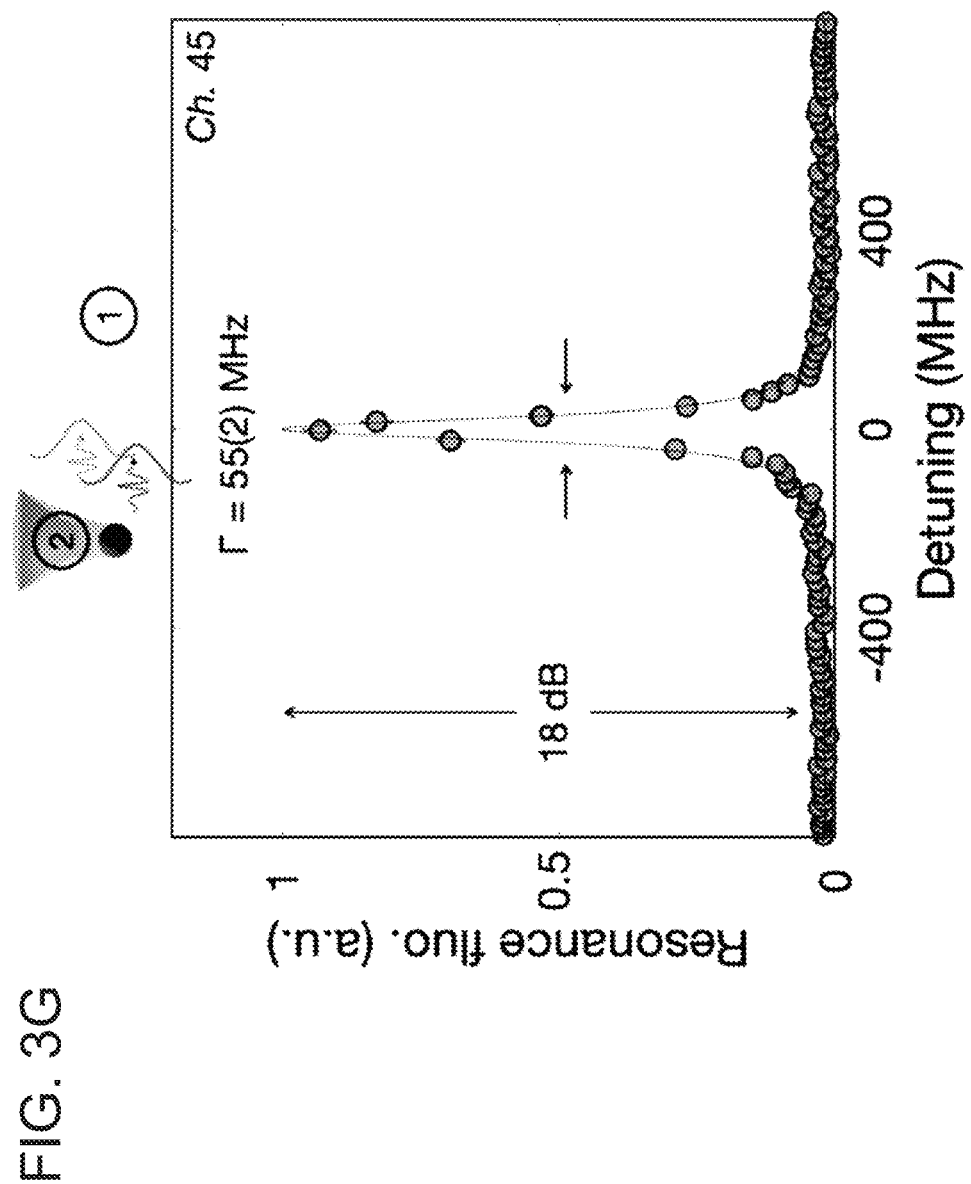
FIG. 3G is a plot of excitation via optical interface ② and fluorescence detection via optical interface ① of FIG. 3A. This geometry allows GeV resonance fluorescence detection at least 18 dB above background, without filtering (spectral, temporal, polarization).

The PIC geometry also enables the direct detection of ZPL resonance fluorescence without any spectral, temporal, or polarization filtering, even under resonant excitation. FIG. 3G plots the resonance fluorescence obtained for top excitation (②) and waveguide collection without filtering in the detection via ①. By polarizing the pump E-field along the waveguide axis to minimize excitation of the TE waveguide mode, this cross-excitation/detection configuration achieves a ZPL intensity 18 dB above background, comparable to free-space diamond entanglement experiments using cross-polarization and time-gated detection.

Figure 3H:
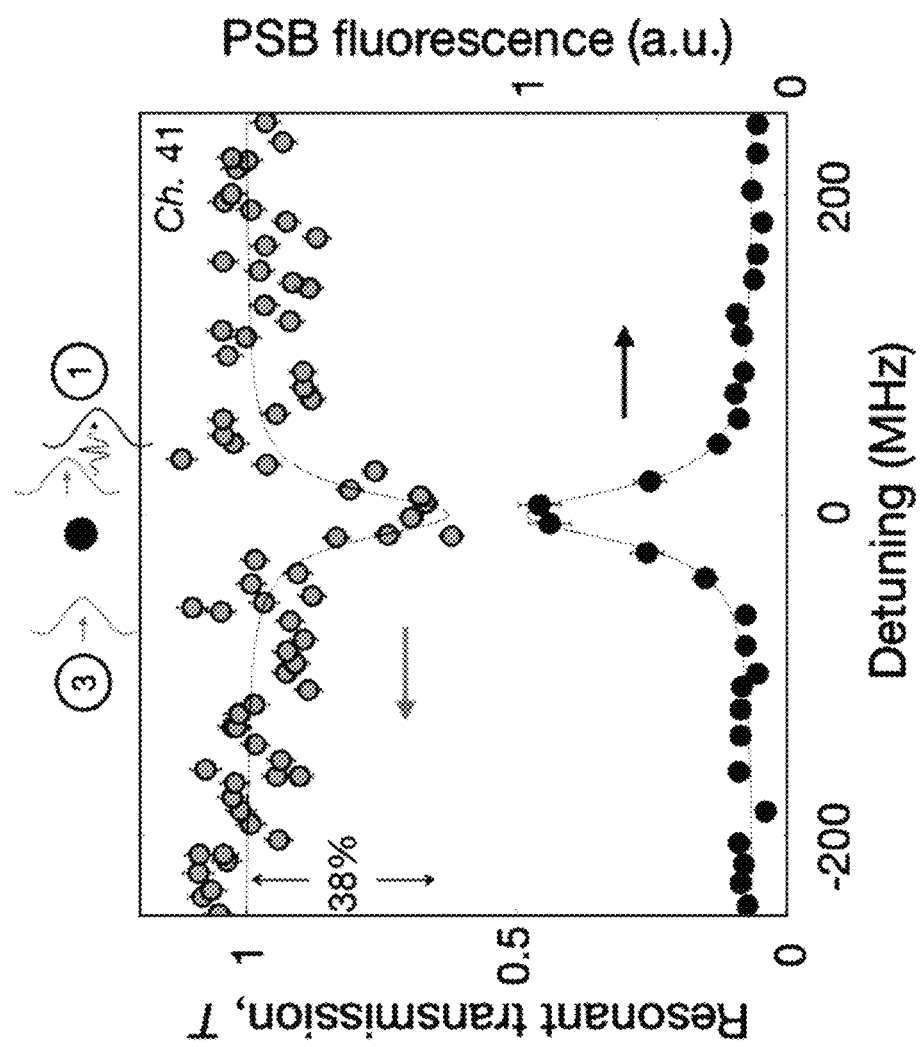
FIG. 3H is a plot illustrating that, in transmission, a single GeV center in the PIC of FIG. 3C causes coherent extinction of $\Delta T/T=38(9)\%$ (upper curve, $\Gamma=35(15)$ MHz). The PLE spectrum is shown in the lower curve ($\Gamma=40(5)$ MHz).

According to finite-difference time-domain simulations of the system, an emitter can have a spontaneous emission coupling efficiency of up to β=0.8 into the diamond waveguide. Experimentally, this efficiency is measured by measuring the transmission of a laser field through a single GeV center (FIG. 3H). By injecting a laser field through ③ and monitoring the transmission T via ①, an extinction of 1−T=0.38(9) is observed when on resonance with the GeV center. This extinction places a lower bound of the emitter-waveguide cooperativity at C=0.27(10) and β=0.21(6). By accounting for residual line broadening and for the ZPL emission fraction (~0.6), the dipole-waveguide coupling efficiency is at least 0.55(18). See below for other factors that reduce β.

Figure 4A:
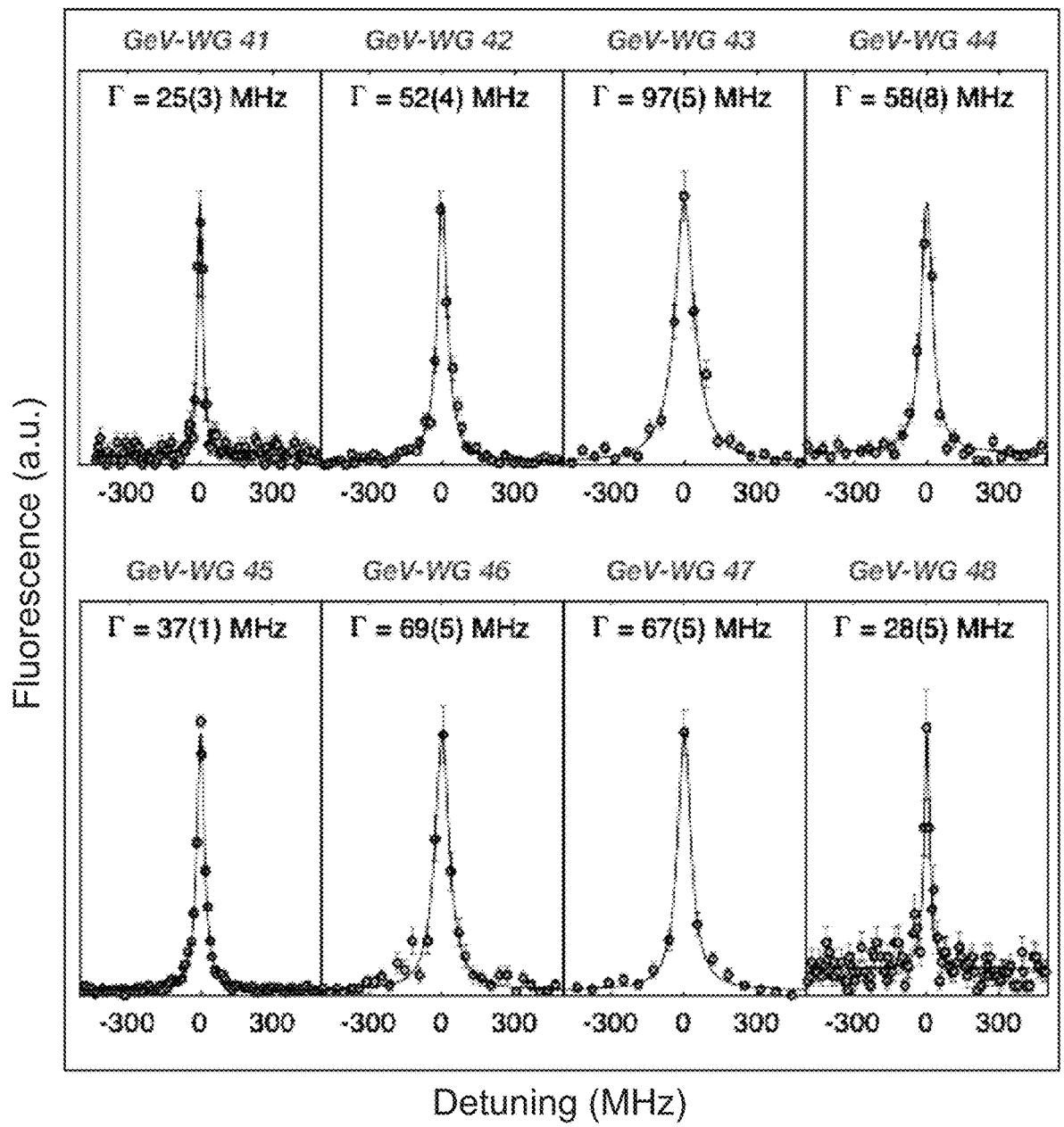
FIG. 4A illustrates plots of PLE spectra of GeV centers in each waveguide of a characteristic 8-channel GeV QMC, with a mean ($\pm$standard deviation) linewidth of $\Gamma=54$ ($\pm24$) MHz.
Figure 4B:
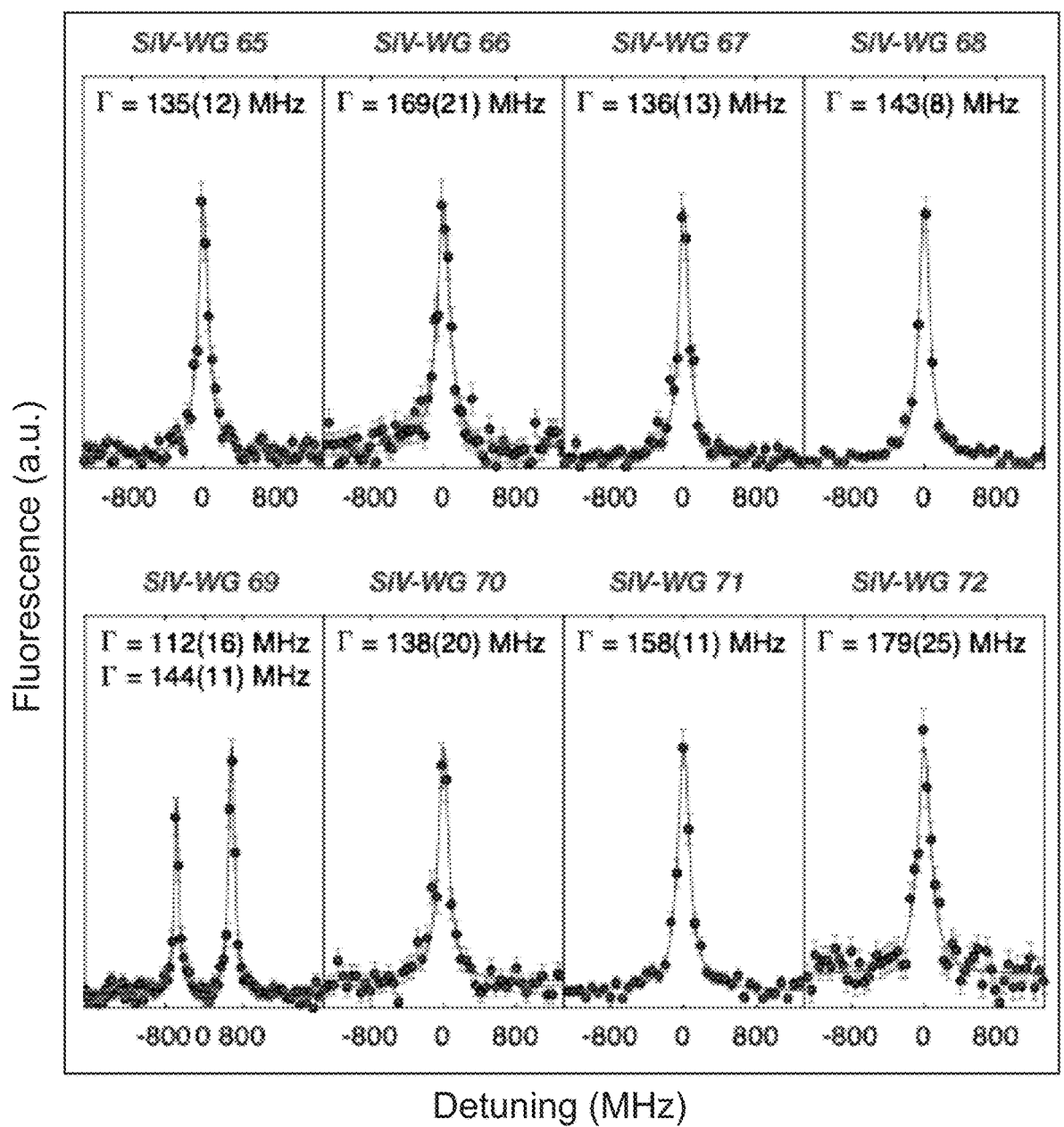
FIG. 4B illustrates plots of PLE spectra of SiVs in an 8-channel SiV QMC, with a mean linewidth $\Gamma=146$ ($\pm20$) MHz.

FIGS. 4A and 4B illustrate the excellent coherence of the GeV center in Channel 41 is not unique to Channel 41. FIG. 4A plots the linewidths of every channel in a characteristic 8-channel GeV diamond chiplet, measured through the on-chip routing of fluorescence into an optical fiber. A mean±standard deviation normalized linewidth of $\Gamma/\Gamma_0=1.7\pm0.7$ was found, with GeV channels 41, 45, and 48 exhibiting lifetime-limited values of 1.0(2), 0.9(1), and 1.0(2), respectively. From these measurements, the inhomogeneous ZPL C transition frequency distribution of 85 GHz was obtained. In waveguides channels 65-72 (see FIG. 3C), an 8-channel QMC of SiV centers was investigated, whose linewidths are shown in FIG. 4B. The SiV centers are also within a factor of $\Gamma/\Gamma_0=1.6\pm0.2$ from SiV centers in bulk diamond, with an inhomogeneous distribution of 30 GHz. In all these measurements, each PLE spectrum was averaged over about 5 minutes (5000 experiments), demonstrating the long-term stability of the optical coherences in the heterogeneously integrated nanophotonic devices.

FIGS. 5A-5C illustrate how the electrical layers in the chip can be used to tune the optical transitions of the diamond color centers. The deformation of a diamond waveguide modifies the orbital structure of an embedded color center and its optical transition, making it possible to strain-tune separate emitters to the same frequency. Here, a QMC was used that includes waveguides with different lengths and therefore different strain responses. As shown in FIG. 5A, a capacitive actuator was fabricated that included one gold electrode 510 (Au 1) on the top side of a diamond QMC 520, separated transversely by 1.5 µm from a gold ground plane 530 (Au 2) on the sapphire region of the AlN chip 540. FIG. 5B shows the fabricated chip/circuit with the QMC 520 suspended over the chip 540. By applying DC voltages, as shown in FIG. 5C, the optical transition C of Emitter 1A (left-pointing triangles) tunes to that of Emitter 1B (right-pointing triangles) near 24.5 V. At 2 V and 12 V, Emitter 2 (circles) in another waveguide channel also overlaps spectrally with Emitters 1A and 1B, respectively, both initially separated from Emitter 2 by about 10 GHz. At higher voltages, tuning ranges up to 100 GHz were observed. These tuning ranges were larger than the inhomogeneous center frequency distribution of 88 GHz and were limited only by stiction between the QMC and the substrate.

These approaches for high-yield integration of large numbers of waveguide-coupled, optically coherent diamond color centers into hybrid PICs can also enable large-scale assembly of other emitter types including NV centers, other diamond Group-IV quantum memories, quantum dots, and rare-earth ion dopants. The same nanofabrication process can produce diamond photonic crystal nanocavities with quality factors over $10^4$, which would enable atom-photon cooperativities in excess of 100. The inclusion of CMOS electronics in this modular architecture would also provide a path towards large-scale chip-integrated quantum control. These advances, taken together with the deterministic assembly of large-scale artificial atoms with PICs with phase-stable interferometers and modulators in AlN or lithium niobate integrated photonics, set the stage for high-rate photon-mediated entanglement generation that underpins applications from multiplexed quantum repeaters to modular quantum computing.

Making and Using a PIC with a QMC

Fabrication of Quantum Emitters

Ion implantation—First, the strained surface was relieved of the single-crystal diamond plate by plasma etching the first 10 µm of diamond in $Ar/Cl_2$, followed by another 5 µm etching in pure oxygen plasma. A focused ion beam (FIB) tool at the Ion Beam Laboratory (Sandia National Laboratories) was used to implant Ge ions (spot size ~35 nm×43 nm) and Si ions (spot size of ~50 nm×45 nm) at an effective areal dose of $2-6\times10^{11}$ ions/cm$^2$ and $4.5-9\times10^{11}$ ions/cm$^2$. The Ge (Si) ion energy was 200 keV (170 keV), which corresponds to an implantation depth of 74±12 nm (113±19 nm) from stopping and range of ions in matter (SRIM) simulations. After implantation, the devices were annealed at 1200° C. in an ultrahigh vacuum furnace. Finally, the diamond was cleaned in a boiling mixture of 1:1:1 sulphuric acid, nitric acid, and perchloric acid.

Conversion yield of GeV and SiV centers—The conversion yields of GeV and SiV centers were analyzed by counting the absence of fluorescent spots in the implantation region (1 µm-pitch, square grid) using PL microscopy. A Poisson distribution P(k), with mean number of color centers λ and number of observed emitters per spot k, models the stochastic emitter creation process. From the mean λ=−log(P(0)) and the implantation dose, the conversion yield of GeV (SiV) centers is estimated to be ~1.9% (3.2%).

Registration of Emitters Using Optical Localization

FIGS. 6A-6E illustrate registration of the fabricated quantum emitters. The quantum emitters were registered relative to pre-fabricated alignment markers, shown in FIGS. 6A and 6B (inset shows emission spectrum of an emitter), using a wide-field and confocal scanning microscope. The emitters were formed on a grid, as shown in FIG. 6C, so the qubit grid was registered, rather than each emitter's location. In particular, the global displacement of the emitter grid was determined from the implantation process, and this offset was used in the subsequent electron-beam lithography of QMCs.

Bottom-up integration of emitter-waveguides/cavity systems allows the post-selection of only the very best emitter systems to be integrated into the PIC. However, this "one-by-one" assembly process can be tedious. Single waveguides and cavities, which have length scales smaller than the diffraction limit of the imaging system, are also difficult to manipulate. We address this problem by creating a single, monolithic frame which contains an array of waveguides. This frame can contain arbitrarily large number of independent waveguide channels. A simple way to increase this number is by including photonic crystal reflectors in the waveguide which makes the photons propagate only in one direction Therefore, a single waveguide with two emitters, one on each side of the reflector, is effectively a two-channel waveguide, increasing the number (or density) of waveguide channels. For example, adding a photonic crystal reflector (array of holes) to a 16-channel waveguide array yields a 32-channel waveguide array.

Monolithic qubit arrays are also compatible with deterministic fabrication by adjusting the waveguide pitches to accommodate the emitter locations. For example, FIG. 6D shows a QMC 608 where the working emitters 618 are distributed irregularly. To compensate for this irregular spatial distribution, waveguides or cavity-coupled waveguides 620 are designed to overlap with the emitters 618. The waveguides 620 are routed to form a regular 2D array at the edge of the QMC 608 for alignment to a regular waveguide array in the PIC socket. In this fashion, high quality emitters can be chosen and integrated into a PIC with a single pick-and-place step.

FIG. 6E is a histogram of the number of emitter-coupled waveguides within a QMC using the process described above with respect to FIGS. 6A-6C. The QMC pitch matches the mean (average) pitch of emitters in FIG. 6E. Due to aberration in the imaging system, some emitters do not align to the waveguide. In this 8-channel QMC, we find that approximately 40% of the fabricated QMCs have perfect yields in that each of the 8 waveguides in the QMC contains at least 1 emitter.

Fabrication of Devices

Quantum Micro-Chiplet (QMC)—After ion implantation and optical registration, a quasi-isotropic diamond etching recipe was used to fabricate suspended QMCs. In particular, 180 nm of silicon nitride (SiN) hard mask was deposited on the diamond using plasma-enhanced chemical vapor deposition. The SiN hard mask was patterned using ZEP-520A electron-beam resist with ESpacer conductive polymer and $CF_4$ reactive-ion etching (RIE). Subsequently, inductively-coupled RIE was used to transfer the pattern from SiN into the diamond layer. Following oxygen etching of the diamond, 15 nm of conformal alumina was deposited via atomic layer deposition (ALD). After a brief breakthrough etch of alumina, the diamond chip was etched in zero-bias oxygen plasma to isotropically undercut the diamond QMCs. Finally, the SiN and alumina masks were removed in hydrofluoric acid. The device was again annealed at 1200 C using the above ultrahigh-vacuum, high temperature annealing recipe, followed by a clean in a boiling mixture of 1:1:1 sulphuric acid, nitric acid, and perchloric acid.

Aluminium nitride photonics—Prior to processing of the AlN PIC, gold alignment markers were patterned to use for alignment between the photonic layer and the metal layers for strain tuning. The AlN photonic circuitry was fabricated from a wafer of 200 nm thick single-crystal AlN on a sapphire substrate grown by hydride vapor phase epitaxy using EBL (ZEP-520A electron-beam resist and ESpacer conductive polymer) and chlorine-based inductively-coupled plasma reactive-ion etching (ICP-RIE). Then, S1813 photoresist served as a protective layer for mechanical edge polishing. The chip was diced using an automatic dicing saw (DISCO DAD-3240). Finally, the chip was polished in order to produce optical-grade facets for edge coupling (Allied MultiPrep Polishing System 8). Finally, sonication in N-Methyl-2-Pyrrolidone (NMP) removed the S1813 protective layer and debris caused by dicing and mechanical polishing.

Metal layers—The fabrication of the metal electrodes and contact pads on top of the PIC substrate immediately followed the patterning of the thin-film AlN and preceded the chip dicing and edge polishing. The PIC substrate metal layer was defined by liftoff of 50 nm Au on top of 5 nm Ti using a single layer of A6 950K PMMA electron-beam resist (450 nm thick), which was aligned relative to the AlN PIC with metal alignment markers. Then, the fabrication of the AlN photonic circuitry proceeded to dicing and polishing, followed by integration of the QMC. After pick-and-place transfer of the QMC to the micro-chiplet socket, a targeted electron-beam metal deposition process was used to place platinum on the periphery of the QMC for electrical connection (FEI Helios NanoLab 600 Dual Beam). This process also locked the QMC into place before resist spin-coating. Finally, the metal electrode layer was defined on top of the QMC by liftoff of 15 nm Au on 5 nm Ti using a single layer of A11 950K PMMA (2 μm thick).

Yield of Defect-Free Microchiplets

Using PL spectroscopy, the occurrence of defect-free 8-channel QMCs was investigated, and is summarized in FIG. 6E. From this histogram, the probability of creating defect-free QMCs was estimated to be 39%. This success probability depends on a variety of factors, including the alignment accuracy of the FIB implantation, the relative calibration between EBL and FIB, as well as the optical registration process. By deterministically placing each element of the QMC over localized emitters, it should be possible to boost the yield to unity.

Pick-and-Place Transfer Process

Piezo-controlled 3-axis and rotation stages were used to align the QMC with the PIC. In addition to the AlN waveguides, the QMC also rests on top of multiple small AlN pedestals to prevent bowing of the diamond structures and stiction with the underlying sapphire substrate. In the case of an inaccurate placement, both the QMC and socket can be reused simply by picking the QMC and re-attempting the placement process. Experimentally, a variety of arrays have been transferred, ranging from single-channel devices all the way to 64-channel QMCs.

High-Efficiency Emitter-PIC Coupling

To transfer the emitted photons from the monolithic frame to a PIC, we can use a pick-and-place method. This method entails using a nano-manipulator controlled by piezo stages to selectively break off the frames from the parent crystal. By van der Waals force or by using a sticky material (such as PMMA, PDMS, etc.), the frames can be attached to the nano-manipulator. The frames then can be released onto the PIC. This method already provides sub-100 nm precision (given by the optical imaging system and the piezo stages). An alternate method to transfer the frames onto the PIC is a so-called 'stamp-and-print' method, which also has similar precision. The accuracy of the placement affects the efficiency of the waveguide coupling from the frame to PIC. These methods improve the precision and accuracy of this coupling.

This precision can be further improved by using computer vision for alignment and computer control for placement to have a production-level system. Further improvement can be achieved using real-time feedback from the emitter photoluminescence coupled to the PIC to ensure the desired coupling between the array frames nanowires and the PIC. High collection of the photoluminescence from each quantum emitter in diamond can be achieved, and photons can be routed through the aluminum nitride PIC and collected via fiber to be detected off-chip, with anti-bunched photons from cross-correlation measurements verifying that single photon emission is coupled from the GeV to PIC.

Auto Alignment Processes

FIGS. 7A-7H illustrate different QMC pickup pad geometries. These QMC pickup pads mate to corresponding placement pads on the PIC to 'lock-in' and enable sub-μm alignment of emitters with waveguides. FIG. 7A shows a top view of a QMC 706*a* and socket 708*a* with front and back lock-in features 716*a* and 718*a*, respectively, for placing the QMC 706*a* in the socket 708*b* from above. FIG. 7B shows a top view of a QMC 706*b* and socket 708*b* with front lock-in features 716*b* and 718*b*, respectively, for sliding the QMC 706*b* into the socket 708*b* from the side. FIG. 7C shows a side view of a QMC 706*c* and socket 708*c* with holes 716*c* and rounded pillars 718*c*, respectively, for placing the QMC 706*c* in the socket 708*c* from above. These lock-in techniques can be scaled to multiple in parallel emitters as shown in FIG. 7D for a four-emitter QMC. FIG. 7E shows an optical micrograph of a successfully locked in placement.

As opposed to SOI or GaAs platforms, which have planar structures whose thicknesses are determined by the layer stacks during growth, monocrystalline materials, such as bulk diamond and bulk silicon, can be made to be both planar and non-planar within the same fabrication process. One such technique is the so-called "quasi-isotropic" etching. By carefully choosing the e-beam or photolithography mask, the waveguide region can be made planar, but the surrounding frames can be non-flat or have different thicknesses than the waveguide region. Therefore, in the PIC chip, structures can be included to restrict the movement of the qubit array frame. By careful design, the qubit array frame can be made to "click" into the desired position given by the accuracy of the lithographic process (typically ~10 nm in e-beam lithography).

FIGS. 7F-7H show the QMC 106 "clicking" into the socket 108 of FIG. 1. FIG. 7F shows the socket's complementary features 128 for locking the QMC 106 in place with precision better than 10 nm. FIG. 7G shows the QMC 'click' structure 126, where the QMC's accentuated corners 126 are thicker than the rest of the QMC 106 after fabrication. And FIG. 7H shows the QMC 106 'clicked' into place in the PIC socket 108. The insets in each figure show the 'click' mechanism design components 126 and 128.

Simultaneous Transfer of Many Structures with Patterned Stamps:

A sticky stamping material (e.g., PMMA or PDMS) can be used to transfer many separate QMCs at once. Often, a certain area of a QMC (e.g., a nanophotonic cavity) is especially sensitive to residue from a stamp. The stamp can be patterned with trenches to avoid touching the most sensitive regions. The structures can have large areas to contact with the stamps.

When stamping many QMCs, these QMCs might have relative misalignment. To align the QMCs properly (e.g., with the self-alignment structures shown in FIGS. 7A-7H), the QMCs should be able to move relative to the stamp substrate. If the stamp is not patterned, stamping could strain the QMC. However, if the stamp has patterned (and flexible in the XY direction) pillars, these pillars can flex to reduce the possibility of damage to the QMC.

Furthermore, the QMCs to be transferred may not have unity fabrication yield. Thus, it can be helpful to select which QMCs are transferred with a stamp (rather than transferring all QMCs at once, including broken QMCs). This can be accomplished by designing a stamp based on pre-characterized QMCs such that only the desired QMCs are transferred. Successive patterned transfers can fill the voids made by broken, untransferred QMCs.

Ultrasonic Release of Devices:

Separating a suspended QMC from a bulk substrate is a challenge. QMCs are usually connected to the bulk substrate by thin tethers, which can be snapped by applying force with the probe. However, this snapping is unreliable and can destroy the QMCs.

A diamond nanobeam has mechanical resonances that depend on the dimensions of the nanobeam. We can release a QMC suspended to a bulk substrate by diamond nanobeams by pumping the resonance of the nanobeams with ultrasonic radiation to the point of breaking. Such ultrasonic frequencies (e.g., around the 100 kHz range for micronlength and ~100 nm width beams) are accessible to existing technologies, such as medical ultrasound.

This ultrasonic release process can be selective to certain QMCs. The QMCs secured by a stamp can be fixed on both sides of the tethers (one side by the substrate, the other side by the stamp). These fixed tethers have a different resonant frequency than unfixed tethers. Thus, it is possible to select which tethers break (i.e., break the tethers for only the QMCs that should be stamped).

Experimental Setup

The hybrid PIC was cooled in a closed-cycle helium cryostat with a base temperature of 4 K (Montana Instruments) with a top-access microscope objective (Mitutoyo 100x ULWD, NA=0.55). Three-axis nanoposition steppers (Attocube ANP-x,z-50) and scanners (Attocube ANS-x,z-50) were used for edge coupling of optical fibers (lensed fiber with a spot size=0.8 μm at 633 nm, or a Nufern UHNA3 fiber) to the PIC. For PL (PLE) spectroscopy, the fiber-coupled fluorescence is filtered in free space using bandpass filters—Semrock FF01-605/15 (FF01-647/57) for GeV centers and FF01-740/13 (FF01-775/46) for SiV centers. GeV (SiV) was off-resonantly pumped using 532 nm (660 nm) lasers. Resonant excitation was achieved using a tunable laser (MSquared SolsTiS with an external mixing module). For PLE, acousto-optic modulators were used to excite emitters with a resonant pulse and an optional 532 nm charge repump pulse. In the resonance fluorescence detection experiment (FIG. 3G), a half-wave plate was placed before Channel ② to reduce laser coupling into the waveguide mode.

To measure the excited state lifetime of single emitters, time-correlated single photon counting (PicoHarp 300) and a pulsed laser source (SuperK, filtered to 532±20 nm) were used. The lifetime curves of the emitters in FIG. 4A were used with biexponential terms to account for fast laser decay and the slower fluorescence decay time constant, $T_1$ (for example, FIG. 8). The inverse of the time constant $T_1$, i.e., $1/T_1$, of the emitter sets the maximum single-photon emission rate from the emitter. Furthermore, $\Gamma=1/(2\pi T_1)$ is the lifetime-limited linewidth of the emitter. Deviation from F in PLE and resonant excitation experiments indicates loss of optical coherence of the emitters. For strain tuning experiments, a programmable voltage source (Keithley 2400) was used, and negligible leakage currents (<0.2 nA) were observed for all applied voltages in this experiment (up to 35 V).

Coupling Efficiencies

Spontaneous emission β-factor: dipole coupling with the waveguide mode—Extinction in resonant transmission spectrum arises from the interference between the scattered and incoming fields, and its depth depends on the dipole-waveguide coupling $\beta=\Gamma_{wg}/(\Gamma_{wg}+\Gamma')$ where $\Gamma_{wg}$ is the emission rate into the waveguide mode and $\Gamma'$ is the decay rate into all other channels. β is related to the transmission via $T=1-[(\beta-2)\beta]/[(1+2\Gamma_d/\Gamma)(1+S)]$, which reduces to the usual expression $T\approx(1-\beta)^2$ in the absence of broadening and far from saturation S≪1. For the measurement in FIG. 3B, operation was at $S \approx 10^{-2}$ with a broadening of $2\Gamma_d/\Gamma_0 = 0.33$ (14). (Again, numbers in parentheses represent one standard deviation error.)

The discrepancy of the experimental $\beta = 0.21(6)$ (0.55(18) after correcting for broadening and a ZPL branching ratio of 0.6) with the simulated $\beta = 0.8$ using the 3D Finite-Difference Time-Domain (FDTD) method (Lumerical Inc) arises from three possible sources: (1) angular and positional misalignment of the dipole in the waveguide; (2) finite population in the upper ground state and emission into transition D; and (3) possible non-radiative processes.

FIGS. 9A and 9B show the normalized |E| fields of 602 nm and 737 nm wavelength, respectively, transverse electric (TE) light coupling from the diamond waveguide (340 nm×200 nm) to the bottom AlN waveguide (800 nm×200 nm), calculated using the 3D-FDTD method. The light transfers adiabatically via tapered sections in the diamond waveguide and AlN waveguide. Here, the coupling region is 9 μm long, with a diamond taper length of 8 μm and AlN taper length of 5 μm. The top insets in FIGS. 9A and 9B show 2D transverse cross sections at different propagation distances along the waveguides. The cross sections at y=-10 (left) and y=1 μm (right) correspond to the fundamental TE mode of the diamond waveguide and AlN-on-sapphire waveguide, respectively. The cross sections at y=-5 μm in FIG. 9A and y=-6 μm in FIG. 9B (center) are the points where half of the light launched from the diamond waveguide is transferred to the AlN waveguide at 602 nm and 737 nm, respectively. The light from the diamond waveguide couples to the AlN waveguide with 97% (98%) efficiency at these wavelengths, with all of the light coupling preferentially to the AlN fundamental TE mode and negligible coupling to higher order modes. This optimized device geometry was determined by optimizing for the coupling efficiency from the fundamental TE mode of the diamond waveguide to the fundamental TE mode of the AlN while sweeping the diamond taper length, the AlN taper length, and the overlap region between the diamond and AlN waveguides.

FIGS. 10A and 10B show the diamond-AlN interlayer coupling efficiency as a function of position offset, relative to the optimum alignment shown in FIGS. 9A and 9B, respectively. In FIG. 2G, a typical transverse placement error of (38±16) nm was shown for the transfer placement of the QMC to the micro-chiplet socket; this displacement corresponds to a decrease of the coupling efficiency to 93% (89%) at 602 nm (737 nm) wavelength. Hence, a 0.46 dB tolerance in the coupling efficiency is within transfer placement accuracy.

PIC to fiber coupling, $\eta_{fiber}$-laser and PL are coupled to and from AlN-on-sapphire waveguides using lensed fibers (Nanonics Imaging Ltd., SM-630 with spot size=0.8±0.3 μm, working distance=4±1 μm) for cryostat experiments and ultra-high NA fibers (UNHA3) for room temperature experiments. Under single-mode operation at 602-737 nm, the in-coupling efficiency is the same as the out-coupling efficiency of AlN waveguide to lensed fiber, which were found to be 51%-57% using the 3D-FDTD method. For the high-NA fiber, which is multimode at wavelengths of interest, the out-coupling efficiency to the fundamental fiber mode is 25% (34%) at 602 nm (737 nm); there is also 1% (3%) coupling into higher order modes.

System efficiency, $\eta$—FIG. 11A shows the response from the idealized two-level system, fitted to $F = F_{sat} P/(P_{sat}+P)$, where P is the continuous-wave 532 nm excitation pump power, $P_{sat}=1.4$ mW is the power required to equally populate the ground and excited states, and F is the measured ZPL fluorescence at the detector and $F_{sat}=195$ kilocounts per second (kcps). To independently measure the system efficiency $\eta = 0.5\beta\eta^{PIC}\eta_{fiber}\eta_{setup}$ where $\eta_{setup} \approx 32\%$ is the external setup and detection efficiency, a pulsed source (SuperK Extreme, 532±20 nm) was used with a repetition rate 13 MHz (one pulse every ~77 ns, slower than the excited state lifetime of 5 ns). Here, the factor of 0.5 accounts for the present configuration in which the photon emission in one direction was collected. At saturation, it was found that $F_{sat}=33(1)$ kcps, which yields $\eta=0.25\%$. In this experiment at room temperature, a high-NA fiber (UHNA3, Nufern) was used for collection with $\eta_{fiber} \approx 25\%$. Therefore, $\eta \approx 2.9\%$ is expected, which is an order-of-magnitude higher than that obtained from the saturation measurement. The major fraction of this discrepancy is attributed to the sensitivity of fiber edge-coupling to the quality of the waveguide facet.

Improving the system efficiency—In experiments described here, the uncladded microchip enables the heterogeneous integration of QMC but the mode-mismatch between the AlN-on-sapphire waveguide and the lensed (high NA) fiber causes at least 3 db (5 dB) insertion losses as characterized above. It is possible to increase the mode overlap by cladding the microchip with alumina or with materials with similar refractive indices as the underlying sapphire. In such a scheme, the AlN waveguides is tapered down at the chip facet to better mode-match with the lensed fiber. FIGS. 10A and 10B shows the designs of edge couplers that can significantly increase the coupling from the AlN waveguide to the lensed fiber to be 84% at 602 nm and 84% at 737 nm, respectively, as well as increase the coupling to high NA fiber to be 89% at 602 nm and 91% at 737 nm, using the present AlN-on-sapphire material and film thickness. In this design, the mode field diameters are matched and the effective refractive index mismatch is reduced between the fundamental TE modes at AlN edge coupler facet and the lensed (high NA) fiber focus spot (facet). Due to the index mismatch, the light coupling is limited by Fresnel reflections at the waveguide facet, which can be reduced using an index-matching environment. Finally, on-chip reflectors in diamond can increase the photon collection efficiency by a factor of two, and photonic crystal cavities can boost the emission into the waveguide mode.

Strain Tuning of a QMC on a PIC

Different optical responses to the emitter-QMC were introduced by changing the length of their constituent waveguides. Here, waveguides of length 20 μm (Type I) and length 15 μm (Type II) were used. To be compatible with the QMC framework, a flexible bridge was included between Type II waveguides and the QMC body (see FIGS. 13A, 5A). FIG. 13B confirms the difference in strain response at 30 V (modeled using COMSOL Multiphysics) between Type I and Type II waveguides. The type II waveguide is less rigid due to the flexible bridge, and therefore experiences a larger strain at the applied voltages.

Response of Optical Transitions to Strain

The single GeV centers (Emitter 1A, Emitter 1B, Emitter 2A) in FIGS. 5A, 5B, and 13A were considered. FIGS. 14A-14C plot the spectral response of the optical transition lines up to an applied voltage of 30 V. From the increasing line splitting of the orbital ground states $A_g$, i.e., between lines C and D (as well as A and B), Emitter 1B is a dipole whose axis lies in the transverse plane of the waveguide. Based on their unidirectional shift of all four lines, Emitters 1A and 2 are dipoles oriented in the longitudinal cross-sectional plane of the waveguide. In particular, the global blue-shift of the lines of Emitter 1A indicates that it resides in a region with compressive strain (i.e. below the neutral axis of the mechanical beam). Conversely, the optical lines of Emitter 2 red-shifts with applied voltage, indicating that it resides in a region with tensile strain, which is located above the neutral axis of the waveguide. Table 1 summarizes the tuning ranges for the two brightest transitions C and D at 30V.

TABLE 1

Shift of optical transitions at 30 V

| Emitter | $\Delta v^C_{30V}$ (GHz) | $\Delta v^D_{30V}$ (GHz) |
| --- | --- | --- |
| 1A | 24 | 24 |
| 1B | 11 | 50 |
| 2 | 19 | 25 |

FIG. 15 shows the robustness of the strain-tuning mechanism as voltages from 10 V to 26 V were repeatedly applied. Above 30 V, over 100 GHz of tuning for Emitter 1A and Emitter 2 (Table 2) is seen; however, in this regime there was hysteresis possibly due to stiction with the underlying gold and substrate about 150 nm and 200 nm away, respectively. Nevertheless, for the purpose here, it was possible to spectrally overlap any pair of the three emitters with less than 25 V. Revised electrodes, QMC, and/or PIC designs in future microchips will be able to overcome this limitation. The small 'pull-in' voltage in this experiment appears earlier than it does in simulation (over 250 V), possibly due to the surface conductivity of diamond.

TABLE 2

Shift of optical transitions at 32 V

| Emitter | $\Delta v^C_{32V}$ (GHz) | $\Delta v^D_{32V}$ (GHz) |
| --- | --- | --- |
| 1A | 100 | 97 |
| 1B | 17 | 50 |
| 2 | 95 | 130 |

Quantum Repeater

Heralded entanglement generation under the Barrett-Kok protocol follows the square of the channel quantum efficiency p. While entanglement generation rates are acceptable for local entanglement, additional propagation loss from a long fiber channel is expected to reduce the entanglement rate below the rate of nuclear spin decoherence, making long-distance entanglement impractical. Reducing the length of fiber between repeater nodes is a potential solution but is unattractive because of the increased cost associated with the additional nodes necessary to bridge the same distance.

FIGS. 16A-16D illustrate a quantum repeater network 1600 that addresses these challenges using the hybrid PIC technologies presented here. FIG. 16A shows the network 1600, which includes a single fiber 1610 connecting PICs 1620 that re-generate qubits and detector chips 1640 that entangle qubits. Each detector chip 1640 receives a pair of input qubits (e.g., single photons A and B as in FIG. 16B), which are incident on a beam splitter 1642. A pair of detectors 1644 measures the beam splitter output. Due to photon quantum interference at the beam splitter, the resulting output indicates whether or not the entanglement between A and B is successful. If the measurement outcome is negative, then entanglement may be attempted again.

Each PIC 1620 can generate qubits (single photons each internally entangled with the spin state of its emitter) on demand. Each include one or more QMCs 1606, which can be made and integrated with the PIC 1620 as described above. The PIC 1620 in FIG. 16C includes two four-channel QMCs 1606, which are coupled to the fiber via respective optical switching trees 1622 and 1624. The optical switches in the output switching tree 1624 can be set to couple the single photons emitted by any channel in the QMCs B1 and B2 1606 to a pair of detectors 1634 via a beam splitter 1632 or to the upstream and/or downstream nodes on the quantum repeater network 1600. After entanglement has been established between nearest-neighbor quantum repeater stations A-B and B-C, entanglement between A-C can be established by interfering the photon emission from 1606 B1 and 1606 B2 at a pair of detectors 1634. This establishes entanglement over A-C.

This quantum repeater network 1600 multiplexes a single fiber 1610 among many qubits simultaneously attempting entanglement, increasing the composite entanglement rate to an acceptable level. After all, a single entanglement attempt only uses a small fraction (~20 ns) of the total protocol repetition time (~10 μs), leaving a wealth of unused fiber time which can be put to better use. The repeater architecture and protocol enabled by the technology presented here are shown in FIG. 16D. However, the multiplexing results in additional challenges. The multiplexed repeater includes many high-quality and spectrally-identical qubits integrated with hardware capable of high-precision electrical and optical control of each qubit. The QMC with emitter tuning ensures spectral indistinguishability, and the electrical lines in the PIC provide electrical control of the qubit. Optical control of each qubit can be achieved using narrowband laser that is resonant with the emitter, along with off-the-shelf electro-optic modulators or on-chip modulators in the PIC itself.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A photonic integrated circuit comprising:
   a substrate;
   a first array of waveguides integrated with the substrate; and
   a solid-state chip integrated onto the substrate in alignment with the first array of waveguides and comprising:
      an array of quantum emitters, formed in the solid-state chip, to emit single photons; and
      a second array of waveguides integrated with the solid-state chip, each waveguide in the second array of waveguides in optical communication with a corresponding quantum emitter in the array of quantum emitters and with a corresponding waveguide in the first array of waveguides to guide the single photons from the corresponding quantum emitter to the corresponding waveguide in the first array of waveguides.

2. The photonic integrated circuit of claim 1, wherein the solid-state chip defines a first alignment feature mated to a second alignment feature defined by the substrate.

3. The photonic integrated circuit of claim 1, wherein the solid-state chip is suspended above the substrate, and further comprising:
   a pair of electrodes, in electrical communication with the solid-state chip and the substrate, to apply a bias voltage to the solid-state chip with respect to the substrate, the bias voltage straining the solid-state chip, thereby tuning an emission wavelength of at least one quantum emitter in the array of quantum emitters.

4. The photonic integrated circuit of claim 1, wherein the quantum emitters in the array of quantum emitters are distributed irregularly within the solid-state chip.

5. The photonic integrated circuit of claim 1, wherein each waveguide in the second array of waveguides has an adiabatically tapered region optically coupled to an adiabatically tapered region of the corresponding waveguide in the first array of waveguides.

6. The photonic integrated circuit of claim 1, wherein a waveguide in the second array of waveguides is in optical communication with a first quantum emitter and a second quantum emitter in the array of quantum emitters, and further comprising:
   a reflector, integrated with the waveguide in the second array of waveguides, to reflect the single photons from the first quantum emitter along the waveguide away from the second quantum emitter and to reflect light from the second quantum emitter along the waveguide away from the first quantum emitter.

7. The photonic integrated circuit of claim 1, further comprising:
   an optical switching network, integrated with the substrate in optical communication with the first array of waveguides, to route at least one of the single photons emitted by the quantum emitters in the array of quantum emitters.

8. The photonic integrated circuit of claim 1, further comprising:
an array of electrodes, disposed on the solid-state chip in electrical communication with the array of quantum emitters, to apply microwave signals to the array of quantum emitters.

9. The photonic integrated circuit of claim 1, further comprising a socket formed on the substrate to receive the solid-state chip.

10. The photonic integrated circuit of claim 9, wherein the solid-state chip further defines a first lock-in feature coupled to a second lock-in feature defined by the socket to secure the solid-state chip on the substrate.

11. A method of making a photonic integrated circuit, the method comprising:
forming a first array of waveguides integrated with a substrate;
forming an array of quantum emitters in a solid-state chip separate from the substrate;
forming a second array of waveguides in the solid-state chip with each waveguide in the second array of waveguides in optical communication with a corresponding quantum emitter in the array of quantum emitters; and
picking and placing the solid-state chip on the substrate such that each quantum emitter in the array of quantum emitters is in optical communication with a corresponding waveguide in the first array of waveguides via a corresponding waveguide in the second array of waveguides.

12. The method of claim 11, wherein forming the array of quantum emitters comprises forming quantum emitters distributed irregularly within the solid-state chip.

13. The method of claim 11, wherein picking and placing the solid-state chip on the substrate comprises aligning the solid-state chip to an alignment feature defined by the substrate.

14. The method of claim 11, wherein picking and placing the solid-state chip on the substrate comprises suspending at least a portion of the solid-state chip above the substrate.

15. The method of claim 14, further comprising:
forming a first electrode in electrical communication with the solid-state chip; and
forming a second electrode in electrical communication with the substrate and electrically isolated from the first electrode.

16. The method of claim 11, wherein forming the first array of waveguides comprises forming first adiabatically tapered regions, forming the second array of waveguides comprises forming second adiabatically tapered regions, and integrating the solid-state chip with the substrate comprises aligning the second adiabatically tapered regions to the first adiabatically tapered regions.

17. The method of claim 11, further comprising:
forming a reflector in optical communication with a waveguide in the second array of waveguides to reflect single photons from the corresponding quantum emitter.

18. The method of claim 11, further comprising:
forming an optical switching network integrated with the substrate and in optical communication with the first array of waveguides.

19. The method of claim 11, further comprising:
an array of electrodes, disposed on solid-state chip in electrical communication with the array of quantum emitters, to apply microwave signals to the array of quantum emitters.

20. The method of claim 11, wherein picking and placing the solid-state chip on the substrate further comprises:
placing the solid-state chip in a socket formed on the substrate; and
locking in the solid-state chip to a lock-in feature defined by the socket to secure the solid-state chip on the substrate.

21. A photonic integrated circuit comprising:
a substrate;
an optical switch network integrated with the substrate;
a first array of waveguides integrated with the substrate in optical communication with the optical switch network;
a first electrode in electrical communication with the substrate; and
a diamond chip suspended over the substrate in alignment with the first array of waveguides and comprising:
an array of quantum emitters, distributed irregularly within the solid-state chip, to emit single photons;
a second array of waveguides integrated with the diamond chip, each waveguide in the second array of waveguides in optical communication with a corresponding quantum emitter in the array of quantum emitters and with a corresponding waveguide in the first array of waveguides to guide the single photons from the corresponding quantum emitter to the optical switch network via the corresponding waveguide in the first array of waveguides; and
a second electrode, in electrical communication with the diamond chip and electrically isolated from the first electrode, to apply a bias voltage across the diamond chip with respect to a potential of the first electrode, the bias voltage straining the diamond chip and tuning an emission wavelength of at least one quantum emitter in the array of quantum emitters.

22. The photonic integrated circuit of claim 21, wherein the array of quantum emitters comprises at least one of a germanium vacancy, a silicon vacancy, a nitrogen vacancy, or a tin vacancy.

23. The photonic integrated circuit of claim 21, wherein the diamond chip is a first diamond chip and the array of quantum emitters is a first array of quantum emitters, further comprising:
a third array of waveguides integrated with the substrate;
a second diamond chip suspended over the substrate in alignment with the third array of waveguides and comprising:
a second array of quantum emitters, distributed within the other solid-state chip, to emit single photons;
a fourth array of waveguides integrated with the solid-state chip, each waveguide in the fourth array of waveguides in optical communication with a corresponding quantum emitter in the second array of quantum emitters and with a corresponding waveguide in the third array of waveguides to guide the single photons from the corresponding quantum emitter to the corresponding waveguide in the third array of waveguides.

* * * * *